(12) United States Patent
Yang et al.

(10) Patent No.: US 11,223,303 B2
(45) Date of Patent: Jan. 11, 2022

(54) MOTOR WITH FORCE CONSTANT MODELING AND IDENTIFICATION FOR FLEXIBLE MODE CONTROL

(71) Applicant: NIKON RESEARCH CORPORATION OF AMERICA, Belmont, CA (US)

(72) Inventors: Pai-Hsueh Yang, Palo Alto, CA (US); Tsutomu Ogiwara, Saitama-ken (JP); Kazuhiro Hirano, Ageo (JP); Bausan Yuan, San Jose, CA (US)

(73) Assignee: NIKON RESEARCH CORPORATION OF AMERICA, Belmont, CA (US)

( * ) Notice: Subject to any disclaimer, the term of this patent is extended or adjusted under 35 U.S.C. 154(b) by 855 days.

(21) Appl. No.: 16/011,291

(22) Filed: Jun. 18, 2018

(65) Prior Publication Data
US 2018/0367067 A1 Dec. 20, 2018

Related U.S. Application Data

(60) Provisional application No. 62/521,862, filed on Jun. 19, 2017.

(51) Int. Cl.
| | |
|---|---|
| *H02N 15/00* | (2006.01) |
| *H02K 41/03* | (2006.01) |
| *H01L 21/68* | (2006.01) |
| *G03F 7/20* | (2006.01) |

(52) U.S. Cl.
CPC ............. *H02N 15/00* (2013.01); *G03F 7/709* (2013.01); *G03F 7/70725* (2013.01); *H01L 21/68* (2013.01); *H02K 41/031* (2013.01); *H02K 41/033* (2013.01); *G03F 7/7085* (2013.01); *H02K 2201/18* (2013.01)

(58) Field of Classification Search
CPC .................. G03F 7/70341; G03F 7/70725
See application file for complete search history.

(56) References Cited

U.S. PATENT DOCUMENTS

| | | | | |
|---|---|---|---|---|
| 5,720,010 A | * | 2/1998 | Watanabe | F16C 32/0444 |
| | | | | 318/568.18 |
| 6,128,552 A | * | 10/2000 | Iwai | F16F 15/002 |
| | | | | 248/550 |
| 7,782,446 B2 | | 8/2010 | Kamidi et al. | |
| 8,355,115 B2 | | 1/2013 | Tousain et al. | |
| 9,229,339 B2 | * | 1/2016 | Butler | G03B 27/53 |
| 9,715,182 B2 | | 7/2017 | Van De Wal et al. | |
| 2003/0071981 A1 | * | 4/2003 | Ueta | G03F 7/70725 |
| | | | | 355/72 |
| 2012/0113405 A1 | * | 5/2012 | Yang | G03F 7/70775 |
| | | | | 355/72 |

(Continued)

*Primary Examiner* — Deoram Persaud
(74) *Attorney, Agent, or Firm* — Roeder & Broder LLP; Steven G. Roeder

(57) ABSTRACT

A method for moving a stage relative to a base includes coupling a magnet assembly to the stage; coupling an array of coils to the base; and directing current to at least one of the coils with a control system that includes a processor to generate a force that levitates the stage relative to the base and moves the stage relative to the base. In one embodiment, the control system generates at least one current command that levitates and moves the stage while inhibiting the excitation of a first targeted flexible mode.

20 Claims, 24 Drawing Sheets

(56) References Cited

U.S. PATENT DOCUMENTS

| | | | |
|---|---|---|---|
| 2013/0116814 A1* | 5/2013 | Yang | G03F 7/70725 700/121 |
| 2014/0204358 A1* | 7/2014 | Yang | G03F 7/70775 355/72 |
| 2014/0285122 A1* | 9/2014 | Lu | H02K 7/09 318/135 |
| 2015/0097498 A1* | 4/2015 | Hemati | H01L 21/00 318/135 |
| 2015/0137624 A1* | 5/2015 | Wu | H02K 41/031 310/12.05 |
| 2015/0241525 A1* | 8/2015 | Yang | G03F 7/70775 318/135 |
| 2015/0241794 A1* | 8/2015 | Yang | G03F 7/70758 257/798 |
| 2015/0338750 A1* | 11/2015 | Yang | H02K 41/031 355/72 |
| 2016/0161288 A1* | 6/2016 | Lu | G01D 5/145 324/207.2 |
| 2017/0111002 A1* | 4/2017 | Hemati | H02J 50/10 |
| 2017/0179805 A1* | 6/2017 | Lu | H02N 15/00 |
| 2018/0205305 A1* | 7/2018 | Chang | G03F 7/70775 |
| 2019/0036405 A1* | 1/2019 | Kimman | H02K 3/28 |

* cited by examiner

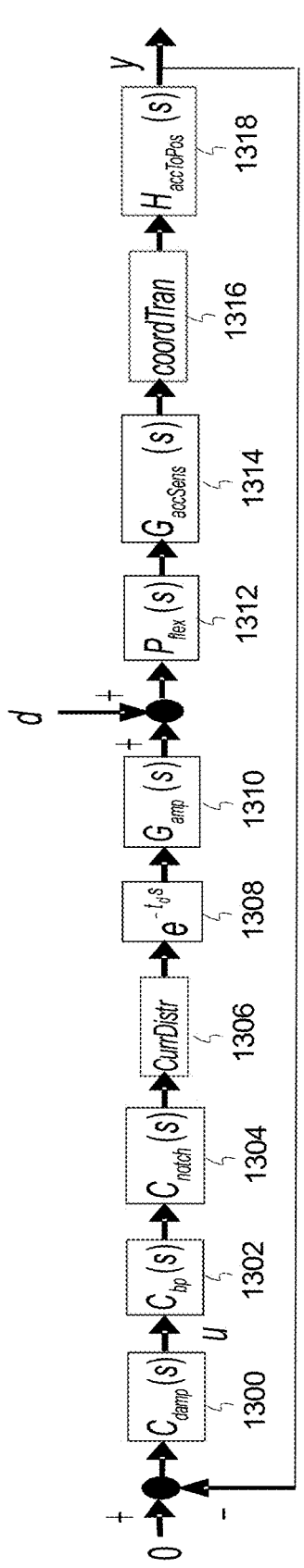
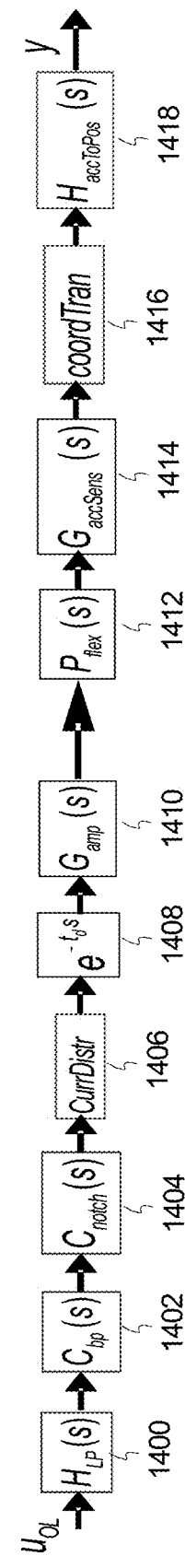
Fig. 13
Fig. 14

MOTOR WITH FORCE CONSTANT MODELING AND IDENTIFICATION FOR FLEXIBLE MODE CONTROL

RELATED APPLICATION

The present application claims priority on U.S. Provisional Ser. No. 62/521,862, filed Jun. 19, 2017, and entitled "MOTOR WITH FORCE CONSTANT MODELING AND IDENTIFICATION FOR FLEXIBLE MODE CONTROL". As far as permitted, the contents of U.S. Provisional Ser. No. 62/521,862 are incorporated herein by reference.

BACKGROUND

Stage assemblies are commonly used to position and move a device during manufacturing, testing, or inspection operation. A typical stage assembly includes a stage base, a stage that retains the device and a stage mover assembly ("mover") that precisely positions the stage and the device. In many applications, such as semiconductor wafer processing, the precise positioning of the wafer is critical to the manufacturing of high density, semiconductor wafers.

Recently, planar motors have been used in the stage mover assembly. Unfortunately, the planar motors are difficult to control and position accurately.

SUMMARY

A method for moving a stage relative to a base from a measured position to a desired position includes coupling a magnet assembly to the stage; coupling an array of coils to the base; and directing current to at least one of the coils with a control system that includes a processor to generate a force that levitates the stage relative to the base and moves the stage relative to the base. In one embodiment, the control system generates at least one current command that levitates and moves the stage while inhibiting the excitation of a first targeted flexible mode.

As alternative, non-exclusive examples, the targeted flexible mode can be flexible mode one, flexible mode two, flexible mode three, flexible mode four, flexible mode five, or flexible mode six.

Additionally, the method can include the step identifying first force constants for the first targeted flexible mode. In this embodiment, the step of directing current includes the step of utilizing the first force constants in the active damping control of the first targeted flexible mode.

Moreover, the step of directing current can include the control system generating at least one current command that levitates and moves the stage while inhibiting the excitation of a second targeted flexible mode. In this embodiment, the method can include identifying second force constants for the second targeted flexible mode; and the step of directing current includes the step of utilizing the second force constants in the active damping control of the second targeted flexible mode.

Further, the step of directing current can include the control system generating at least one current command that levitates and moves the stage while inhibiting the excitation of a third targeted flexible mode. In this embodiment, the method can include identifying third force constants for the third targeted flexible mode; and the step of directing current includes the step of utilizing the third force constants in the active damping control of the third targeted flexible mode.

Moreover, the step of directing current can include the control system including a flexible mode feedback controller that uses phase correction to reduce the influence of phase lag on the flexible mode control.

In one embodiment, the control system utilizes a pseudo inverse based commutation to generate at least one current command that accounts for a rigid body mode of the stage and at least one flexible mode of the stage.

In certain embodiments, one or more flexible mode sensors are coupled to the stage that generates flexible mode information. For example, the first force constants for the first targeted flexible mode can be identified using the flexible mode information.

The present invention is directed to a stage mover assembly, an exposure apparatus, a method for making a semiconductor wafer, and a method for moving and positioning a device.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 8 includes a plurality of graphs that illustrate coil flexible mode force constants;

FIG. 10 includes a plurality of graphs that illustrate coil flexible mode force constants;

FIG. 13 is a simplified control block diagram that illustrates one example of flexible mode damping control;

FIG. 14 is a simplified control block diagram that illustrates one example of correction phase measurement;

DESCRIPTION

Figure 1:
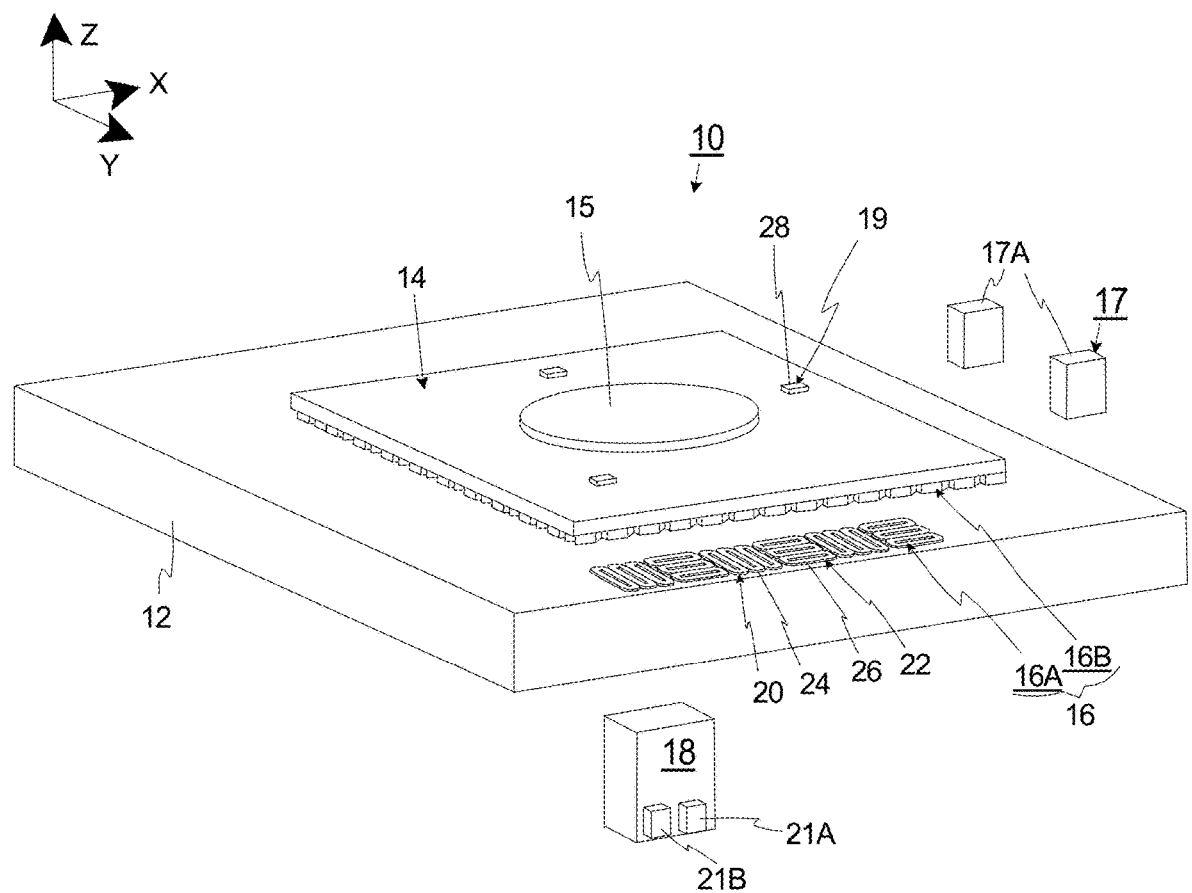
FIG. 1 is a perspective view of a stage assembly having features of the present invention.

Referring initially to FIG. 1, a stage assembly 10 having features of the present invention includes a base 12, a stage 14 that retains a device 15 (also referred to as a "workpiece"), a stage mover assembly 16 that moves and positions the stage 14 and the device 15, a rigid body measurement system 17 (illustrated as boxes) that measures the position and/or movement of the rigid body of the stage 14, a control system 18 that controls the stage mover assembly 16, and a flexible mode sensor assembly 19 that is used to determine and control one or more flexible modes of the stage 14. The design of each of these components can be varied to suit the design requirements of the stage assembly 10.

As an overview, the stage 14 has mode shapes that include rigid body modes and flexible modes. Rigid body modes do not involve any deformation of the stage 14. In contrast, flexible body modes involve deformation of the stage 14 caused by the forces imparted on the stage 14 by the stage mover assembly 16. The flexible body modes are influenced by the design of the stage 14.

As provided herein, the flexible mode force constants for flexible mode actuation are identified. Subsequently, the stage 14 can be positioned while actively controlling the damping of one or more targeted flexible modes using one or more of the corresponding flexible mode force constants. Thus, the problem of accurately positioning a stage is solved by identifying the flexible mode force constants of one or more targeted flexible modes, and by the proposed active damping control using the identified results. As a result thereof, the control system 18 is uniquely designed to direct current to the stage mover assembly 18 in a fashion that positions the stage 14 while inhibiting excitation of one or more targeted flexible modes. With this design, the control system 18 can control the stage mover assembly 18 to position the stage 14 and workpiece 15 more accurately, and the stage mover assembly 18 can properly position the stage 14 faster. This will improve the quality of a workpiece 15 manufactured using the stage 14, and the throughput of the assembly. For example, for semiconductor wafer processing, the precise positioning of the wafer/workpiece 15 allows for the manufacturing of higher density, semiconductor wafers. This will also improve the speed, size and performance of the devices that utilize the higher density wafers.

Some of the Figures provided herein include an orientation system that designates a X axis, a Y axis, and a Z axis that are orthogonal to each other. In these Figures, the Z axis is oriented in the vertical direction. It should be understood that the orientation system is merely for reference and can be varied. For example, the X axis can be switched with the Y axis and/or the stage assembly 10 can be rotated. Moreover, these axes can alternatively be referred to as the first, the second, or a third axis. For example, the X axis can be referred to as the first axis, the Y axis can be referred to as the second axis, and the Z axis can be referred to as the third axis.

The stage assembly 10 is particularly useful for precisely positioning the device 15 during a manufacturing and/or an inspection process. The type of device 15 positioned and moved by the stage assembly 10 can be varied. For example, the device 15 can be a semiconductor wafer, and the stage assembly 10 can be used as part of an exposure apparatus for precisely positioning the semiconductor wafer during manufacturing of the semiconductor wafer (semiconductor device). Alternatively, for example, the stage assembly 10 can be used to move other types of devices during manufacturing and/or inspection, to move a device under an electron microscope (not shown), or to move a device during a precision measurement operation (not shown).

The base 12 is coupled to the stage mover assembly 16, receives the reaction forces generated by the stage mover assembly 16, and can be any suitable structure. In certain embodiments, the base 12 can be a reaction assembly that counteracts, reduces and minimizes the influence of the reaction forces from the stage mover assembly 16 on the position of other structures on the exposure apparatus. For example, the base 12 can be a rigid, rectangular shaped counter mass that is maintained above a counter mass support (not shown) with a reaction bearing (not shown) that allows for motion of the base 12 relative to the counter mass support along the X axis, along the Y axis, and about the Z axis. For example, the reaction bearing can be a vacuum preload type fluid bearing, a magnetic type bearing, or a roller bearing type assembly. Alternatively, for example, the stage assembly 10 can include a reaction frame (not shown) that couples the base 12 to another structure.

In one embodiment, the stage assembly 10 includes a single stage 14 that is moved relative to the stage base 12. Alternately, for example, the stage assembly 10 can be designed to include multiple stages that are independently moved relative to the stage base 12.

In FIG. 1, the stage 14 retains the device 15. The design of the stage 14 can be varied greatly to suit the design requirements of the stage 14. In the non-exclusive embodiment illustrated in FIG. 1, the stage 14 is monolithic and includes a device holder (not shown) for retaining the device 15. The device holder can be a vacuum chuck, an electrostatic chuck, or some other type of clamp. Alternatively, the stage assembly 10 could be designed to have a fine stage (not shown) that is positioned on the stage 14.

The stage mover assembly 16 controls and adjusts the position of the stage 14 and the device 15 relative to the stage base 12. For example, in FIG. 1, the stage mover assembly 16 is a planar motor that moves and positions of the stage 14 with six degrees of freedom (or movement), e.g. along the X, Y, and Z axes, and about the X, Y, and Z axes, relative to the base 12. Alternatively, the stage mover assembly 16 can be designed to move the stage 14 with less than six degrees of freedom, e.g. with three degrees of freedom.

In FIG. 1, the stage mover assembly 16 is a planar motor that includes a conductor assembly 16A (only a portion is illustrated in FIG. 1), and a magnet assembly 16B positioned adjacent to the conductor assembly 16A. Moreover, one of the assemblies 16A, 16B is secured to the stage 14 and the other of the assemblies 16B, 16A is secured to the base 12. In FIG. 1, the conductor assembly 16A is secured to the base 12 and the magnet assembly 16B is secured to the stage 14. For a moving magnet assembly 16B design, the conductor assembly 16A is larger along the X and Y axis than the magnet assembly 16B.

In this embodiment, the conductor assembly 16A includes a plurality of X conductor units 20 and a plurality of Y conductor units 22. In certain embodiments, the X conductor units 20 are arranged in an alternating fashion with the Y conductor units 22 along the X axis and along the Y axis to create a checkerboard pattern. In this embodiment, each X conductor unit 20 includes a plurality of X coils 24 that are positioned side-by-side along the X axis, and each Y conductor unit includes a plurality of Y coils 26 that are positioned side-by-side along the Y axis. The number of coils in each conductor ("coil") unit 20, 22 can be varied to vary the design of the mover assembly. For example, each conductor ("coil") unit 20, 22 can include three coils 24, 26, often referred to as a U coil, V coil, and W coil. Alternatively, each coil unit 20, 22 can be designed to have more than three or fewer than three coils. Thus, each coil unit 20, 22 includes at least one coil.

Further, in certain embodiments, all of the conductor units 20, 22 are attached to the top of the base 12, are in substantially the same plane, and have the same Z axis position. With this design, the coils 24, 26 are organized in a two dimensional planar array.

Further, the magnet assembly 16B can include a plurality of magnets that are attached to the bottom of the stage 14, that are in substantially the same plane and have substantially the same Z axis position. In one non-exclusive embodiment, the plurality of magnets are configured in a two dimensional, somewhat checkerboard pattern in which adjacent magnets have a different polarity (e.g. alternate between the south pole facing the conductor assembly 16A and the north pole facing the conductor assembly 16A).

The measurement system 17 monitors the position and/or movement of the rigid body of the stage 17 relative to a reference and provides a measurement signal to the control system 18. With this information and information from the sensor assembly 19, the control system 18 can control the stage mover assembly 16 to precisely position the device 15. For example, the measurement system 17 can include one or more rigid body sensors 17A (only two are illustrated) such as encoders, interferometers, autofocus systems, and/or other measuring devices. It should be noted that the rigid body sensors 17A measure the displacement of the stage 14, including displacement caused by moving of the rigid body and displacement caused by flexible modes. Stated in another fashion, in certain embodiments, the measurement system 17 is not able to decouple the flexible mode movement from rigid-body movement. Thus, generally speaking, the measurement system 17 measures the position of the stage 14 without consideration of flexible modes.

For the six degree of freedom mover illustrated in FIG. 1, the measurement system 17 needs to provide six degree of measurement information of the physical position of stage 14 to control the position of the stage 14 for the six degrees of freedom. For example, in this embodiment, the measurement system 17 can utilize six or more rigid body sensors 17A (only two are illustrated in FIG. 1).

The control system 18 is electrically connected to, directs and controls electrical current to the conductor assembly 16A of the stage mover assembly 16 to precisely position the device 15 using the measurement signals from the measurement system 17 and the sensor signals from the flexible mode sensor assembly 19. The control system 18 can include one or more electronic storage devices 21A, one or more processors 21B, and programs that preform the functions described herein. With a moving magnet planar motor 16, the control system 18 directs current to a plurality of coils 24, 26 to energize the coils 24, 26. With this design, the overall motor forces generated on the stage 14 are contributed from each of individual energized coils 24, 26 which interact with the magnet assembly 16B to generate six degree of freedom forces on the stage 14. Stated in another fashion, each individual energized coil 24, 26 (which interacts with the magnet assembly 16B) generates a rigid body force on the stage 14 that can be used to move the position of the rigid body of the stage 14. In certain embodiments, the control system 18 directs current to more than six coils 24, 26 to position the stage 14 with six degrees of freedom while reducing the excitation of one or more of the flexible modes of the stage 14. As provided herein, the control system 18 must direct current to more coils 24, 26 than the number of degrees of freedom to reduce the excitation of one or more of the flexible modes of the stage 14.

As provided above, besides the intended stage CG rigid-body mode forces, those coil forces may also excite the stage flexible modes of the stage 14. Since generally more than six coils 24, 26 may be energized, with each outputting significant forces, besides controlling the six axes (along the X, Y, and Z axes, and about the X, Y, and Z axes) of the stage 14, the control system 18 can direct current to the coils 24, 26 to control and/or reduce the excitation of one or more of the flexible modes of the stage 14. Thus, in certain embodiments, the present invention energizes more six coils 24, 26 to actively position the stage in six axes and reduce the excitation of one or more of the flexible modes of the stage 14.

In certain embodiment, the present invention does not consider all of the flexible modes of the stage 14. For example, in certain embodiments, the higher order, flexible modes of the stage 14 are not considered because the excitation frequency is too high.

As provided herein, the flexible mode sensor assembly 19 can be used to identifying the flexible mode force constants of one or more targeted flexible modes, and/or to provide information for the control of the stage mover assembly 16 in a fashion that dampens one or more targeted flexible modes. This allows for the positioning of the stage 14 with increased accuracy.

As used herein, the term "flexible mode force constants" of "force constants" shall mean an "array of constants that represents how much flexible mode motion is created by a predetermined current (e.g. one amp) that is directed to one coil (or coil unit depending upon the design of the control system). It should be noted that the value of flexible mode force constants will vary depending on if current is independently controlled to each of the coils, or when the coil amplifiers are constrained by 3-phase balance condition so that current to each of coil units is independently controlled. Typically, one amp current directed to one coil (or one coil unit) will result in some rigid body motion and some flexible mode motion. The flexible mode force constants will be different for each coil or coil unit of the conductor assembly 16A, the flexible mode force constants will vary according to position of the magnet assembly 16B relative to the conductor assembly 16A, and the flexible mode force constants will be different for each flexible mode.

In certain applications during the operation of the stage assembly 10, the position of the magnet assembly 16B relative to the conductor assembly 16A will change greatly along the X and Y axes, but be substantially constant along the Z axis, and about the X, Y and Z axes. For this type of operation, for each coil (or coil unit), the flexible mode force constants for each flexible mode will be a function of X and Y position.

The design of the flexible mode sensor assembly 19 can vary pursuant to the teachings provided herein. For example, the flexible mode sensor assembly 19 can include one or more spaced apart flexible mode sensors 28 that are secured to the stage 14 to measure the flexible mode motion of the stage 14. More specifically, in one, non-exclusive embodiment, a different flexible mode sensor 28 can be positioned at locations suitable for picking up each targeted flexible mode. The number and type of flexible mode sensors 28 can be varied. As non-exclusive examples, the number of spaced apart flexible mode sensors 28 can be approximately 1, 2, 3, 4, 5, 6, 7, 8, 9, 10, 15, or 20. Generally speaking, the number of flexible mode sensors 28 is equal to or greater than the number of targeted flexible modes desired to be controlled. In FIG. 1, the flexible mode sensor assembly 19 includes three flexible mode sensors 28 that can be used to control identify and control three, targeted flexible modes of the stage. The one or more flexible mode sensors 28 are placed on the stage 14 at locations where they can detect significant displacements of the targeted flexible modes.

As a non-exclusive example, one or more of the flexible mode sensors 28 can be an accelerometer that picks up acceleration displacement of flexible modes without rigid-body modes. Thus, the flexible mode sensor 28 is able to decouple the flexible mode movement from rigid-body modes.

Alternatively, one or more of the flexible mode sensors 28 can be a strain gage, a piezoelectric transducer ("PZT") strain sensor, and/or another type of sensor that is able to decouple the flexible mode movement from rigid-body movement.

Figure 2:
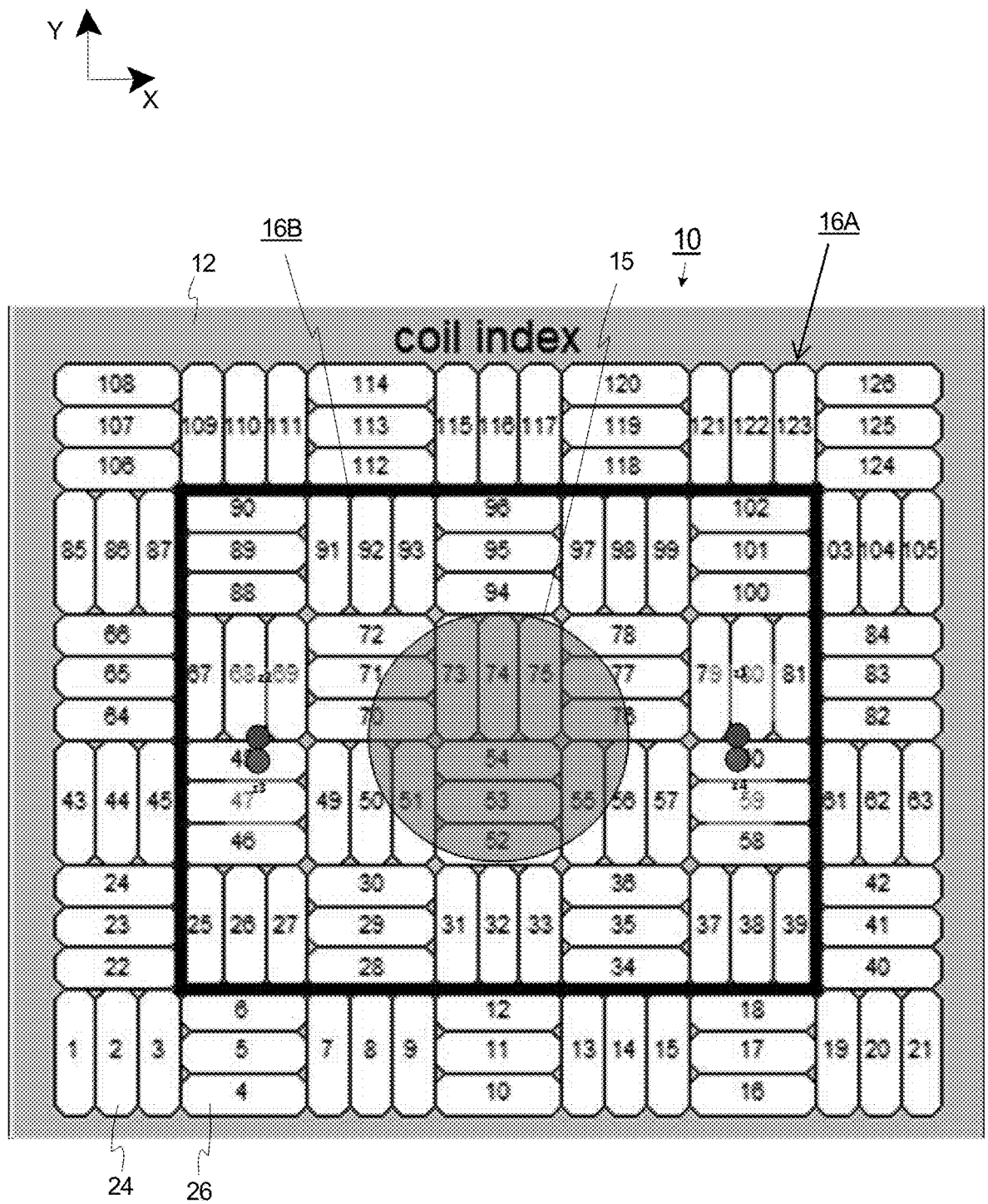
FIG. 2 is simplified illustration of the stage assembly with the coils numbered for reference.

FIG. 2 is simplified illustration of the stage assembly 10 including the device 15, the base 12, an outline of the magnet assembly 16B, and the conductor assembly 16A with the coils 24, 26 numbered for reference. In this embodiment, the conductor assembly 16A includes one hundred and twenty-six coils 24, 26 that are arranged in a planar array. Alternatively, the conductor assembly 16A can be designed to include more than or fewer than one hundred and twenty-six coils 24, 26.

As an overview, for active control, the mode shapes of the targeted flexible modes are generally required to decouple their dynamics from rigid-body and other, non-targeted flexible modes. First, the present invention formulates the mode shape into the form of flexible mode force constants of motor coils. Subsequently, the present invention provides an identification procedure for the flexible mode force constants for each targeted flexible mode. Next, the present invention teaches how to use the flexible mode force constants in the active damping control of targeted flexible modes to improve the positioning of the stage 14.

As provided herein, the coil force constant of the $k^{th}$ flexible mode of the stage may be modeled as follows.

$$\varphi_{k,coil} = \sum_{i=1}^{N} \vec{\phi}_{k,i} \cdot \vec{\delta f}_i \qquad \text{Equation (1)}$$

In Equation (1) and elsewhere,
(i) N=number of elements in a coil;
(ii) $\vec{\phi}_{k,i}$=$k^{th}$ mode displacement of element i;
(iii) $\delta \vec{f}_i = (\vec{I}_i \times \vec{B}_i) \cdot \delta v_i$=force of coil element i;
(iv) $\vec{I}_i$=current of coil element i;
(v) $\vec{B}_i$=flux of coil element i; and
(vi) $\delta v_i$=volume of coil element i.

Figure 3A:
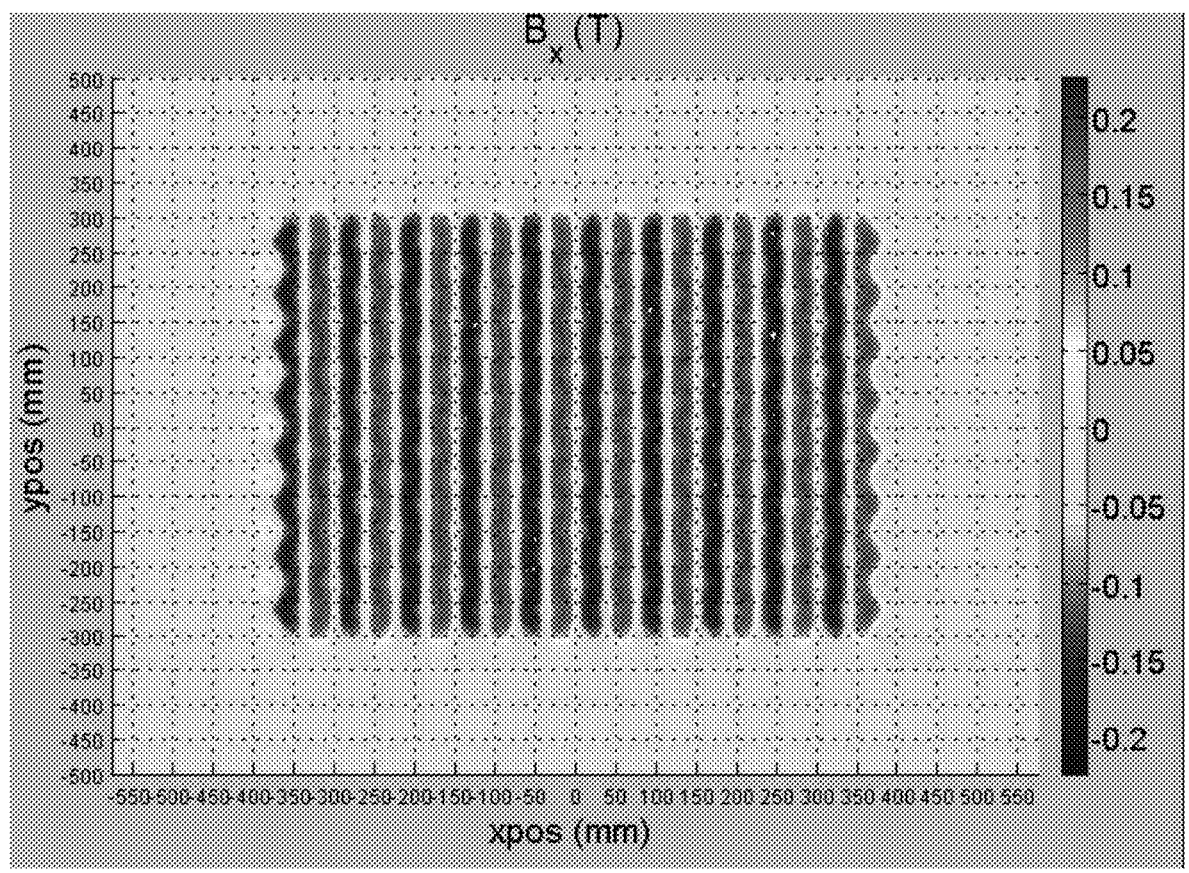
FIGS. 3A, 3B, and 3C illustrate alternative magnet flux density distributions for a magnet assembly.
Figure 3B:
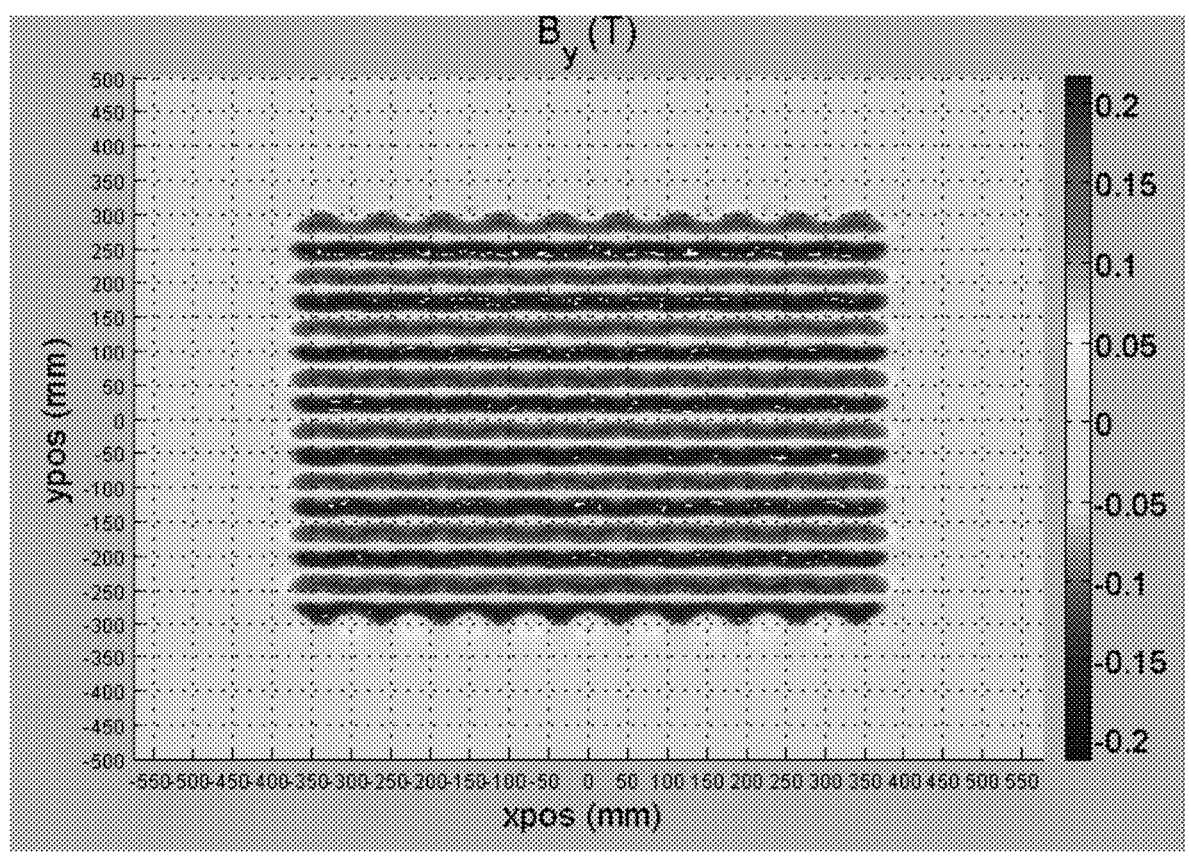
Figure 3C:
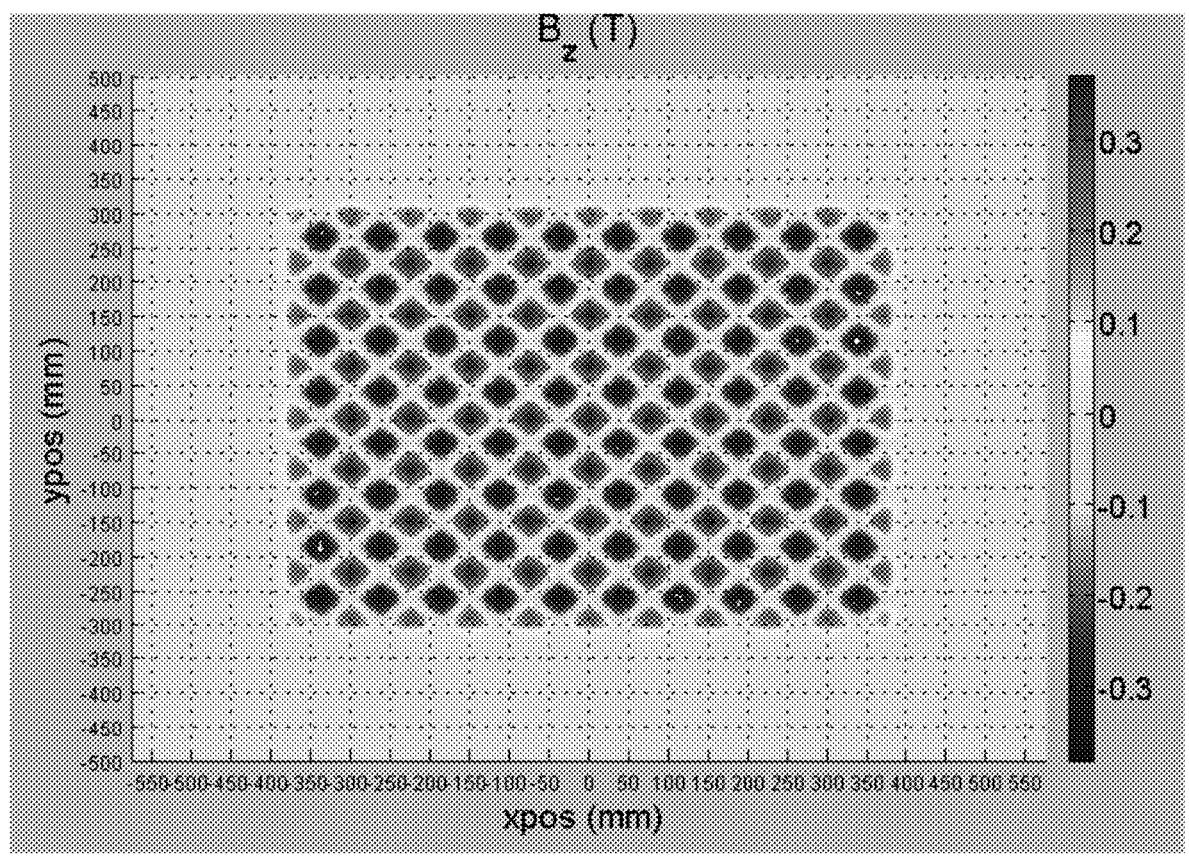

FIG. 3A illustrates the modeled, magnet flux density distribution along the X axis ("$B_x(T)$") for a magnet array (e.g. the magnet assembly 16B); FIG. 3B illustrates the modeled, magnet flux density distribution along the Y axis ("$B_y(T)$") for the magnet array (e.g. the magnet assembly 16B); and FIG. 3C illustrates the modeled, magnet flux density distribution along the Z axis ("$B_z(T)$") for the magnet array (e.g. the magnet assembly 16B).

Figure 4:
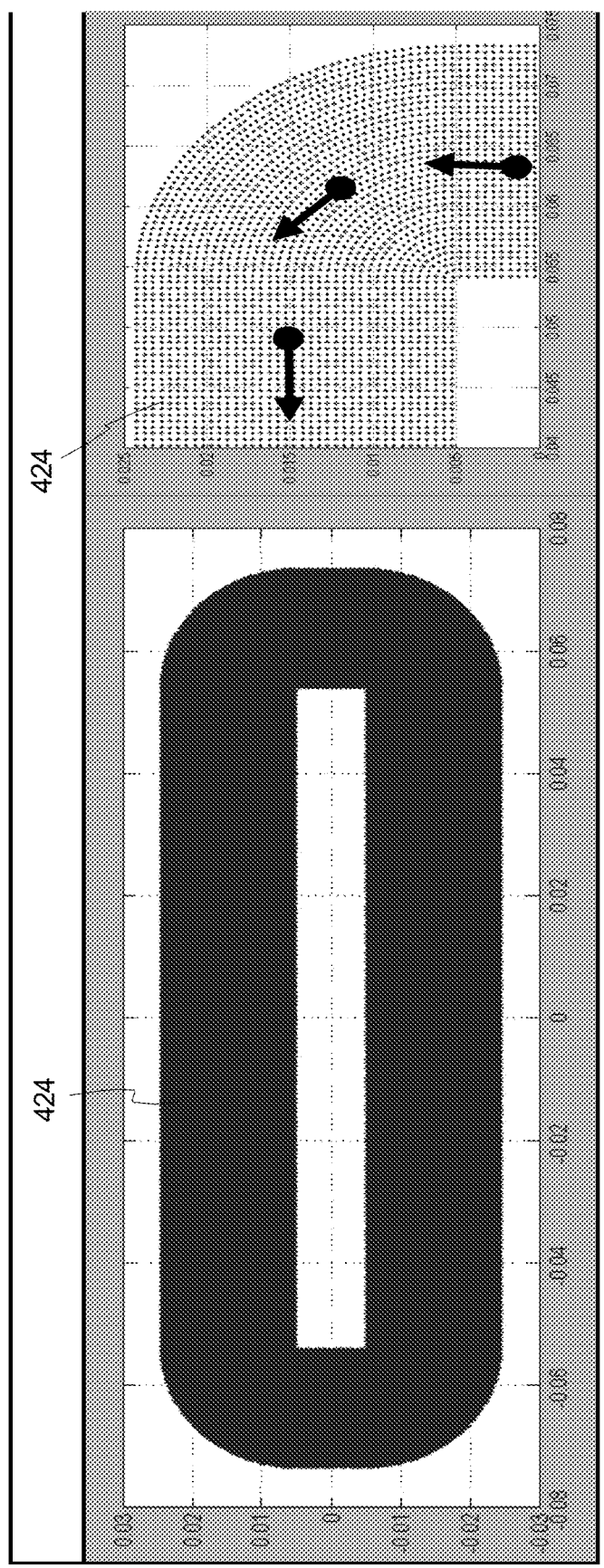
FIG. 4 illustrates a top view of a coil, and an enlarged portion of the coil.

FIG. 4 includes a top view of a coil 424, and an enlarged portion of the coil 424 with arrows illustrating the current direction for the associated coil model. When current is directed through the coil 424, each portion of the coil 424 will cooperate with the magnet assembly 16B (illustrated in FIG. 1) to generate a force.

As provided herein, the flexible mode force constants can be determined using Equation (1) for each targeted flexible mode. For example, the targeted flexible modes can include flexible mode 1, flexible mode 2, flexible mode 3, flexible mode 4, flexible mode 5, and flexible mode 6.

Figure 5:
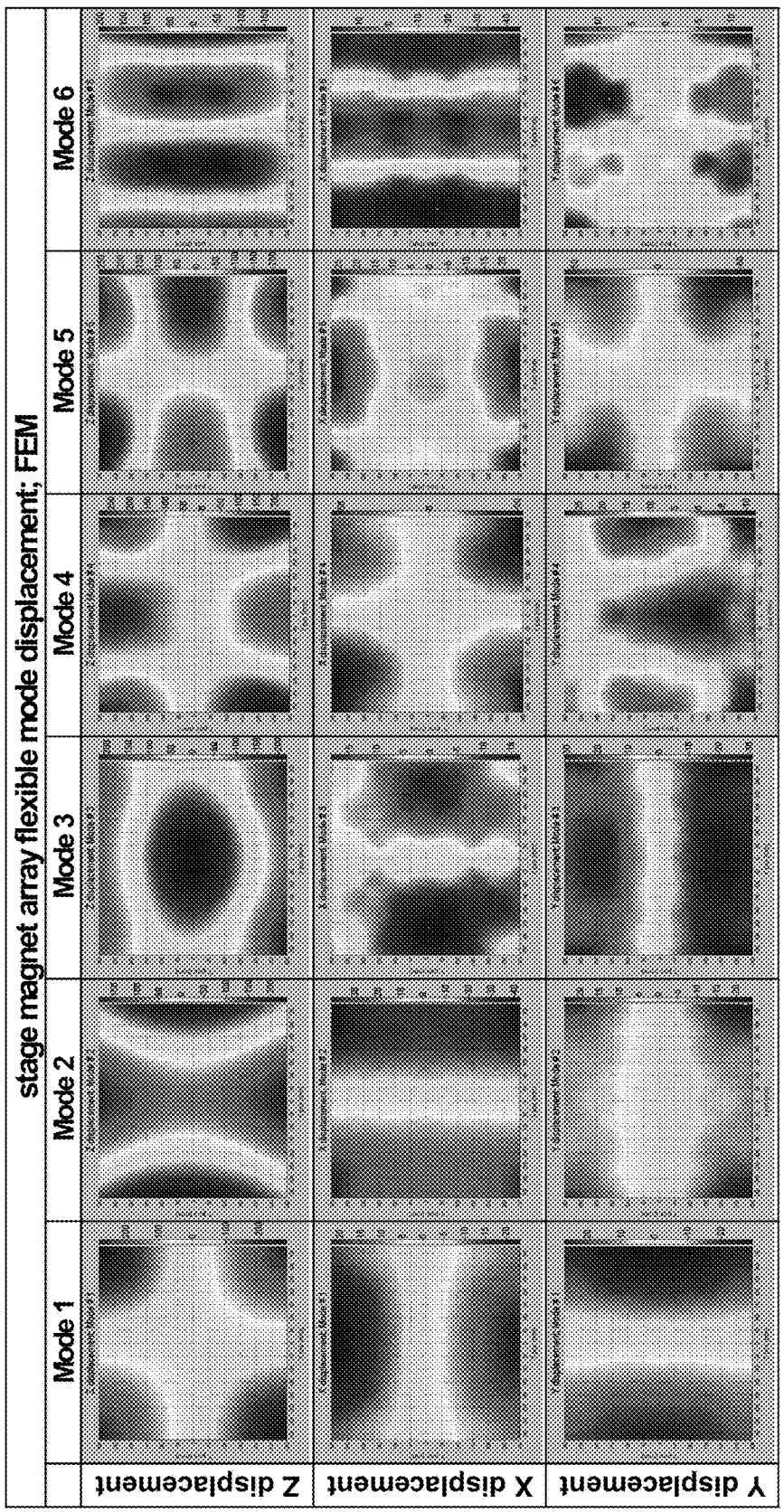
FIG. 5 includes a plurality of graphs that illustrate stage magnet array flexible mode displacement.

FIG. 5 includes (i) a top row of graphs that illustrate the Z axis, flexible mode displacements of the stage (at a position just above the magnet array) relative to X-Y axis position for the flexible mode 1, flexible mode 2, flexible mode 3, flexible mode 4, flexible mode 5, and flexible mode 6, respectively, that were generated for use in the flexible mode force constant modeling of Equation (1); (ii) a middle row of graphs that illustrate the X axis, flexible mode displacements of the stage (at a position just above the magnet array) relative to X-Y axis position for the flexible mode 1, flexible mode 2, flexible mode 3, flexible mode 4, flexible mode 5, and flexible mode 6, respectively, that were generated for use in the flexible mode force constant modeling of Equation (1); and (iii) a bottom row of graphs that illustrate the Y axis, flexible mode displacements of the stage (at a position just above the magnet array) relative to X-Y axis position for the flexible mode 1, flexible mode 2, flexible mode 3, flexible mode 4, flexible mode 5, and flexible mode 6, respectively, that were generated for use in the flexible mode force constant modeling of Equation (1).

The motor flexible mode force constants for the targeted flexible modes for the stage can also be experimentally measured. As provided above, the flexible mode force constants will vary depending on if current is independently controlled to each of the coils, or when the coil amplifiers are constrained by 3-phase balance condition so that current to each of coil units is independently controlled.

Figure 6:
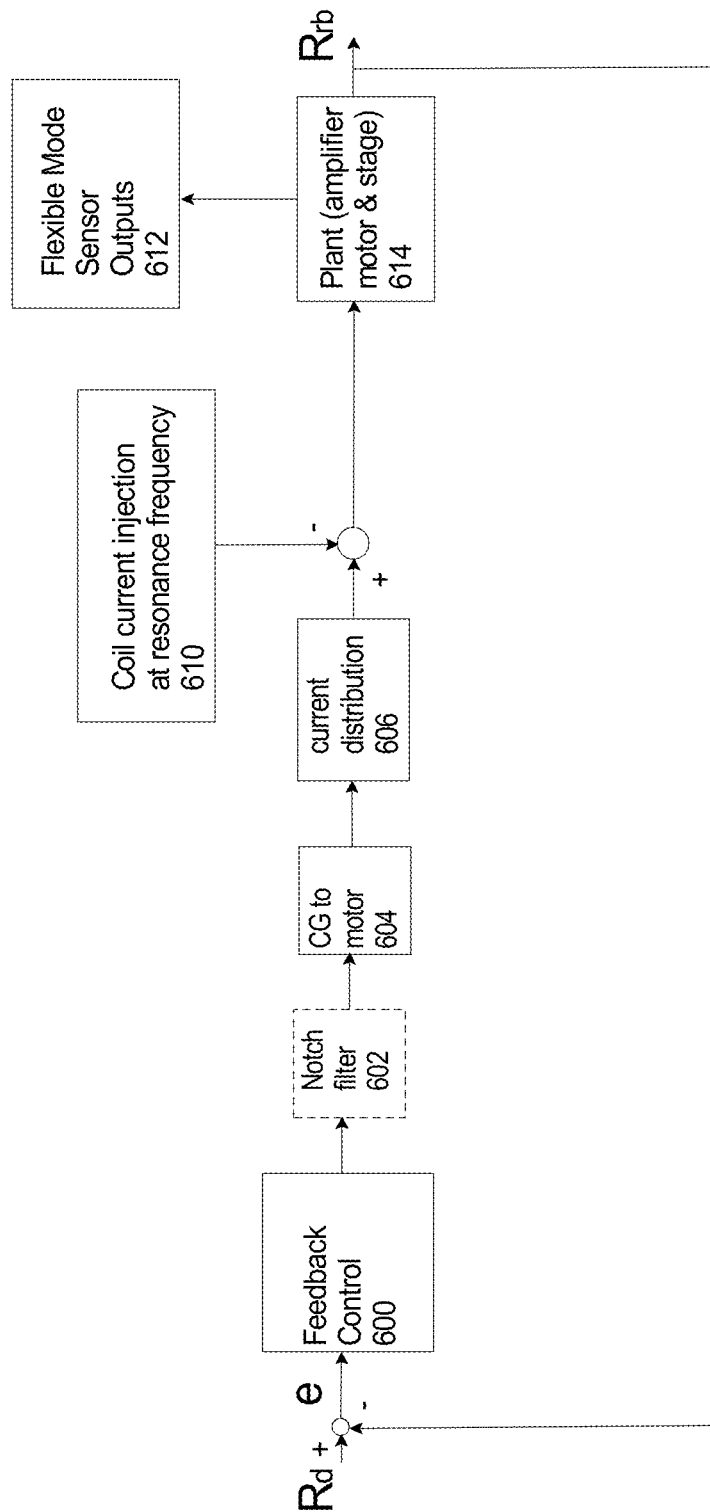
FIG. 6 is a control graph that illustrates how a stage can be controlled to experimentally determine the flexible mode force constants for a targeted flexible mode.

FIG. 6 is a control graph that illustrates how the stage can be controlled by the control system to experimentally determine the flexible mode force constants for one or more targeted flexible modes for a stage mover assembly in which the current is independently controlled to each of the coils. In FIG. 6, the control diagram includes a feedback control 600, a notch filter 602, a center of gravity to motor block 604, and a current distribution block 606 that are used to move the plant 614. In FIG. 6, the control graph also includes a coil current injection at resonance frequency block 610 and a flexible mode sensor output block 612.

As provided above, the one or more flexible mode sensors are placed on the stage at locations where they can detect significant displacements of the targeted flexible modes. The output from the flexible mode sensors is represented by the flexible mode sensor output block 612.

Each targeted flexible mode has a corresponding resonance frequency. For example, (i) a first targeted flexible mode has a corresponding first resonance frequency; (ii) a second targeted flexible mode has a corresponding second resonance frequency; (iii) a third targeted flexible mode has a corresponding third resonance frequency; and (iv) a fourth targeted flexible mode has a corresponding fourth resonance frequency. Further, each corresponding resonance frequency will be different. It should be noted that the first resonance frequency is selected to be at a frequency that primarily excites the first targeted flexible mode and does not excite the other flexible modes very much. Similarly, the second resonance frequency is selected to be at a frequency that primarily excites the second targeted flexible mode and does not excite the other flexible modes very much. The other resonance frequencies are selected in a similar fashion. With this design, the appropriate resonance frequency can be injected into the control loop to determine the corresponding flexible mode force constants for each targeted flexible mode.

It should be noted that each targeted flexible mode can be alternatively referred to as a flexible mode of interest. Additionally, it should be noted that flexible modes that are not being controlled by the control system can be referred to as non-targeted flexible modes.

Each targeted flexible mode will have a corresponding flexible mode force constant for each coil that will vary according to the position of the magnet assembly 16B (illustrated in FIG. 1) relative to the conductor assembly 16A (illustrated in FIG. 1). As provided above, in certain applications, the position of the magnet assembly 16B relative to the conductor assembly 16A will change greatly along the X and Y axes during the operation of the stage assembly 10. For this type of operation, for each coil, the flexible mode force constants for each targeted flexible mode will be a function of X and Y position.

In FIG. 6 (i) "$R_d$" represents a desired reference position, e.g. the desired trajectory (along the X, Y, and Z axes, and about the X, Y, and Z axes) of the stage 14 (or device 15) at a particular moment in time; (ii) "$R_{rb}$" represents a measured, actual momentary, position (six degree of freedom, e.g. along the X, Y, and Z axes, and about the X, Y, and Z axes) of the stage 14 (or device 15) as measured by the rigid body sensors 17A (illustrated in FIG. 1) at a particular moment in time; and (iii) "e" represents a rigid body following error between the desired reference position and the measured position.

In FIG. 6, starting at the left side of the control block diagram, the following error "e" is fed into the feedback control block 600. The feedback control 600 determines the rigid body forces commands along and about the X, Y and/or Z axes that are necessary to correct the following error "e" and maintain the constant position of the stage. The rigid body force commands are subsequently filtered by the notch filter block 602. Next, the center of gravity to motor block 604 transforms the stage rigid body force commands to the motor force commands. Next, at block 606 the current distribution is generated that is to be directed to the stage mover assembly 16 to move the stage.

With this design, under stage feedback control of rigid-body axes, and with the stage 614 being levitated, a single-frequency excitation signal at a resonance frequency of a targeted flexible mode is injected from block 610 to the current command of each of the coils one by one. Meanwhile, the notch filter 602 at the injected frequency is applied to every feedback control loop of the six rigid body axes to avoid the interference of feedback control on the flexible mode sensor outputs measured at block 612. For each targeted flexible mode, the measurement is conducted at all the interested XY positions. For each targeted flexible mode, when its corresponding flexible mode force constants are being experimentally determined, the stage mover assembly is momentarily controlled to maintain the stage in a levitated (along the Z axis) position with a constant position along the X, Y, and Z axes, and about the X, Y, and Z axes. Subsequently, the X-Y position of the stage is changed and the process is repeated.

More specifically, for a first targeted flexible mode, (i) the stage is controlled to be levitated at a first X-Y position relative to the conductor assembly; (ii) the corresponding first resonance frequency is injected into a first coil at block 610; (iii) the notch filter 602 is set to filter out the first resonance frequency; and (iv) the flexible mode sensor outputs are measured at block 612. Next, for the first targeted flexible mode, (i) the stage is controlled to be levitated at the first X-Y position; (ii) the corresponding first resonance frequency is injected into a second coil (different than the first coil) at block 610; (iii) the notch filter 602 is set to filter out the first resonance frequency; and (iv) the flexible mode sensor outputs are measured at block 612. For the first targeted flexible mode, this process is repeated for the each of the individual coils at the first X-Y position. Subsequently, for the first targeted flexible mode, the entire process can be repeated for each of the individual coils of the conductor assembly at a second X-Y position (that is different from the first X-Y position). Next, for the first targeted flexible mode, the entire process can be repeated for each of the individual coils of the conductor assembly for each of the different possible (or desired) X-Y positions to generate the corresponding flexible mode force constants.

Similarly, for a second targeted flexible mode, (i) the stage is controlled to be levitated at a first X-Y position relative to the conductor assembly; (ii) the corresponding second resonance frequency is injected into the first coil at block 610; (iii) the notch filter 602 is set to filter out the second resonance frequency; and (iv) the flexible mode sensor outputs are measured at block 612. Next, for the second targeted flexible mode, (i) the stage is controlled to be levitated at the first X-Y position; (ii) the corresponding second resonance frequency is injected into the second coil at block 610; (iii) the notch filter 602 is set to filter out the first resonance frequency; and (iv) the flexible mode sensor outputs are measured at block 612. For the second targeted flexible mode, this process is repeated for the each of the individual coils at the first X-Y position. Subsequently, for the second targeted flexible mode, the entire process can be repeated for each of the individual coils of the conductor assembly at a second X-Y position (that is different from the first X-Y position). Next, for the second targeted flexible mode, the entire process can be repeated for each of the individual coils of the conductor assembly for each of the different (or desired) X-Y positions to generate the corresponding flexible mode force constants.

It should be noted that these processes can also be repeated each of the other targeted flexible modes.

Subsequently, for each single-frequency excitation signal, for each coil and each position, a discrete Fourier transform ("DFT") values of injected current command from block 610 and the flexible mode sensor outputs 612 at the excitation frequency are recursively calculated. The DFT ratio of sensor output to the coil current commands is generally a complex number. After normalization with respective to the phase of a dominating complex number, the real parts of those DFT ratios are the flexible mode force constants.

Figure 7:
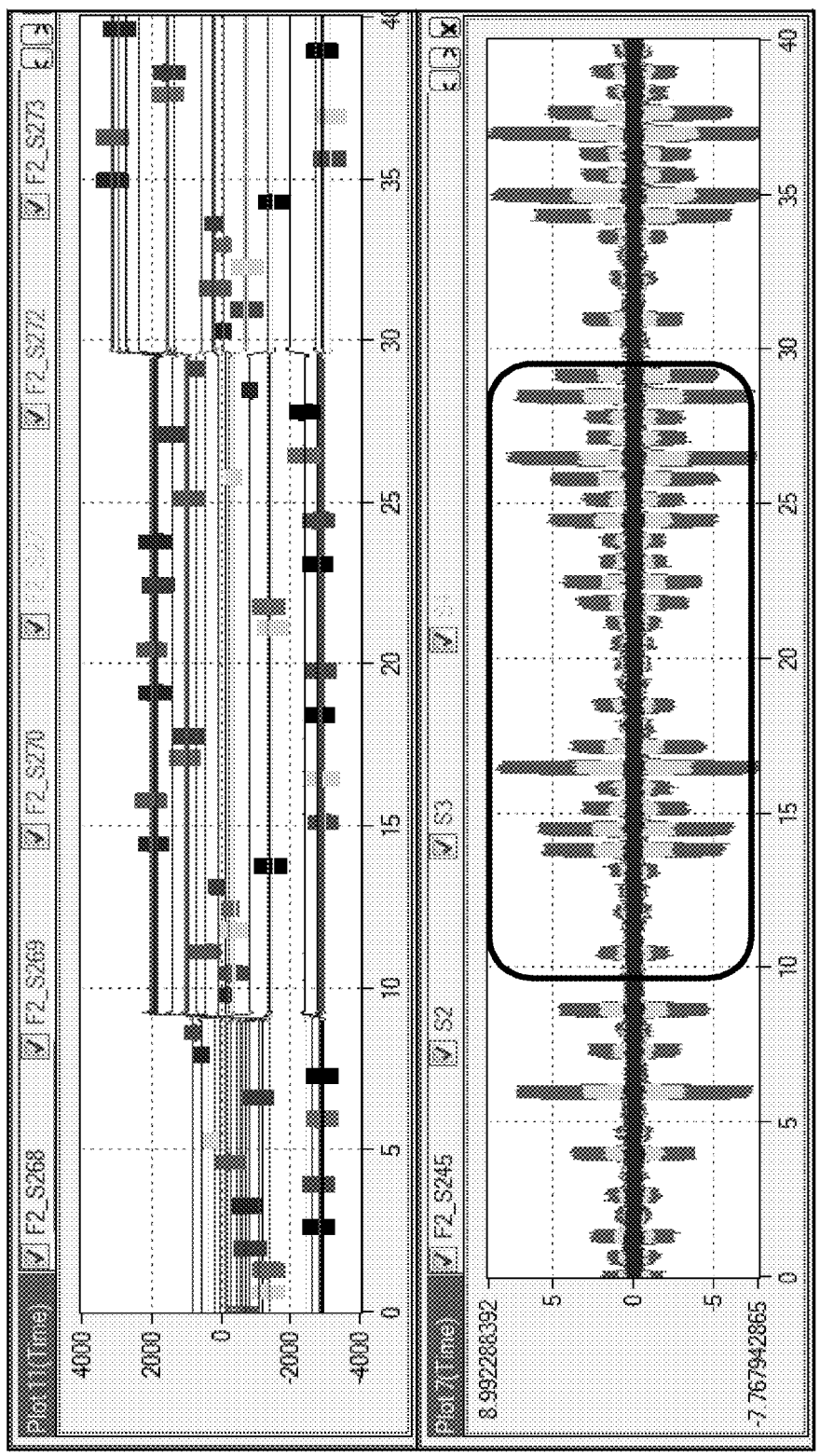
FIG. 7 includes a graph that illustrates coil current commands during the first flexible mode-shape measurement, and a graph that illustrates the corresponding output signals of the flexible mode sensors.

FIG. 7 includes an upper graph that illustrates coil current commands during the first flexible mode-shape measurement at a specific (X-Y) stage position. Additionally, FIG. 7 includes a lower graph that illustrates the corresponding output signals of the flexible mode sensors 28 mounted on the stage. As provided above, this data is used to calculate the flexible mode force constants for the first flexible mode.

Figure 8:
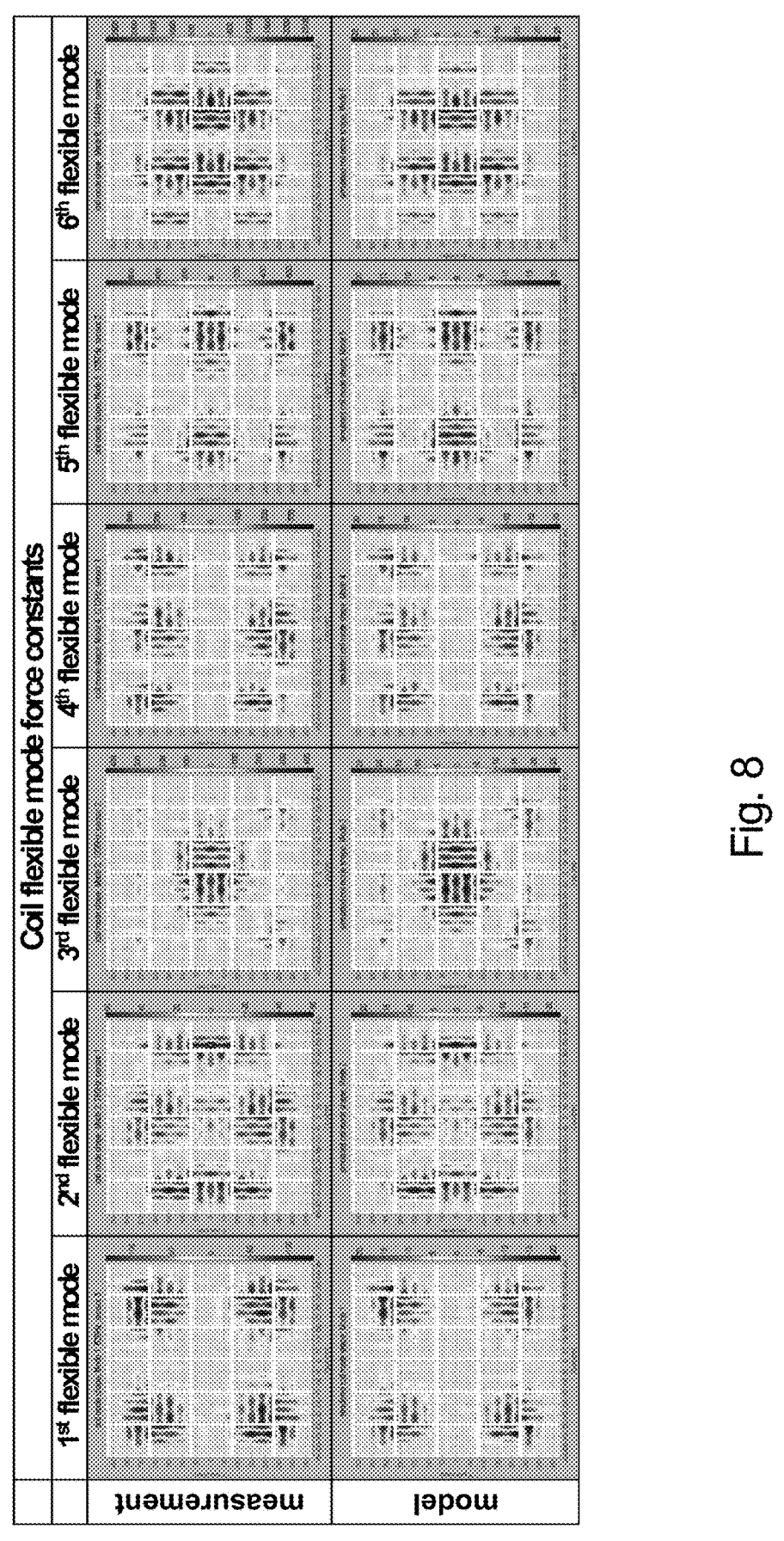

FIG. 8 includes a top row of graphs that illustrate (i) the measured flexible mode force constants versus X-Y position for the first flexible mode, (ii) the measured flexible mode force constants versus X-Y position for the second flexible mode, (iii) the measured flexible mode force constants versus X-Y position for the third flexible mode, (iv) the measured flexible mode force constants versus X-Y position for the fourth flexible mode, (v) the measured flexible mode force constants versus X-Y position for the fifth flexible mode, and (vi) the measured flexible mode force constants versus X-Y position for the sixth flexible mode. Additionally, FIG. 8 includes a lower row of graphs that illustrate (i) the modeled flexible mode force constants versus X-Y position for the first flexible mode, (ii) the modeled flexible mode force constants versus X-Y position for the second flexible mode, (iii) the modeled flexible mode force constants versus X-Y position for the third flexible mode, (iv) the modeled flexible mode force constants versus X-Y position for the fourth flexible mode, (v) the modeled flexible mode force constants versus X-Y position for the fifth flexible mode, and (vi) the modeled flexible mode force constants versus X-Y position for the sixth flexible mode. As illustrated in FIG. 8, very similar patterns appear in the measured and modeled coil flexible mode force constants. Scaling differences between two data sets are due to sensor scaling and can be absorbed into the control gain later.

It should be noted that if the first flexible mode is a targeted flexible mode, then the corresponding flexible mode force constants are used by the control system to direct current to the coils in a fashion that inhibits amplification of the first flexible mode. Similarly, if the second flexible mode is a targeted flexible mode, then the corresponding flexible mode force constants are used by the control system to direct current to the coils in a fashion that controls the second flexible mode. The same can be said for the other flexible modes if is desired to control them.

As provided above, when the coil amplifiers are constrained by 3-phase balance condition, the stage mover assembly needs to be controlled in terms of coil unit current commands. As a result thereof, different flexible mode force constants are required for each targeted flexible mode. These different flexible mode force constants can again be determined experimentally.

Figure 9:
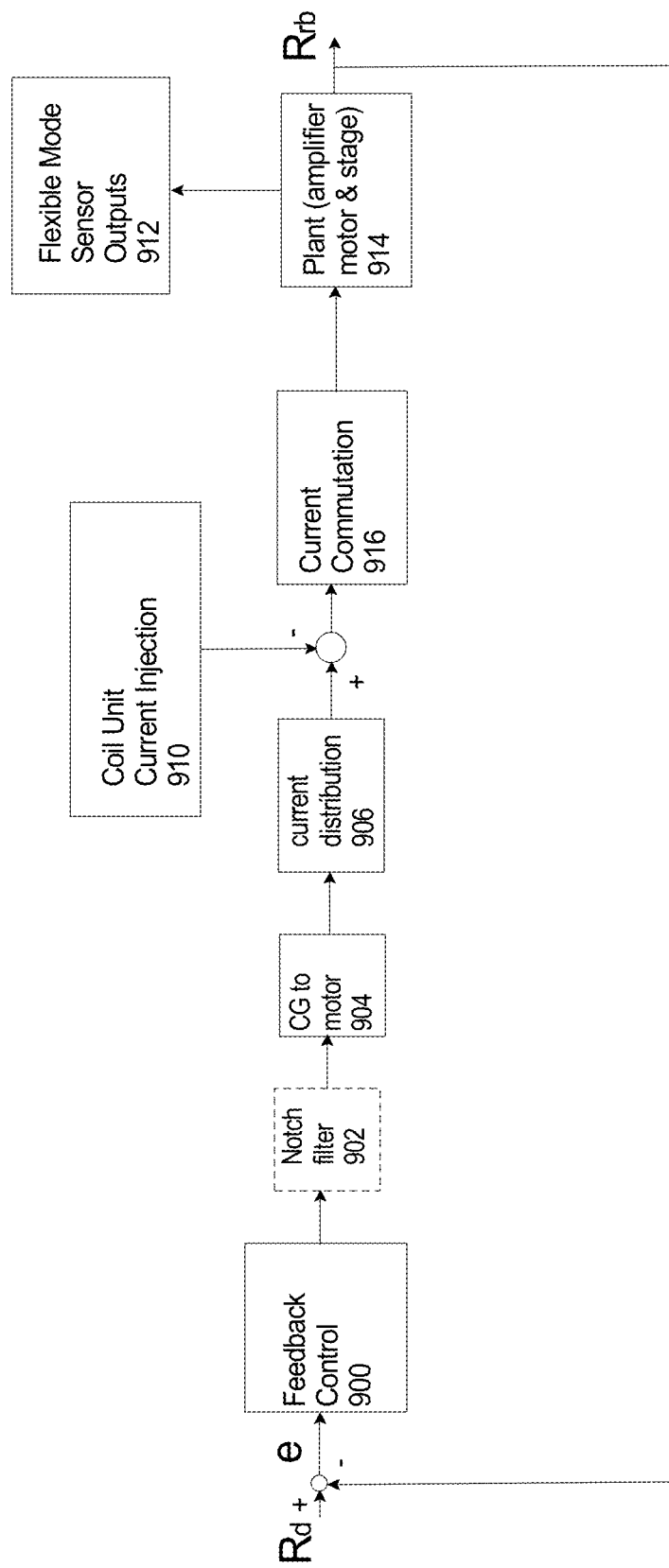
FIG. 9 is another control graph that illustrates how a stage can be controlled to experimentally determine the flexible mode force constants for a targeted flexible mode.

FIG. 9 is a control block diagram that illustrates how the stage can be controlled by the control system to experimentally determine the flexible mode force constants for one or more target flexible modes for a stage mover assembly in which the current is independently controlled to each coil unit. In FIG. 9, the control diagram includes a feedback control 900, a notch filter 902, a center of gravity to motor block 904, and a current distribution block 906 that are used to move the plant 914. In FIG. 9, the control graph also includes a coil unit current injection at resonance frequency block 910 and a flexible mode sensor output block 912. All of these blocks are similar to the corresponding blocks described above and illustrated in FIG. 6. However, the control diagram of FIG. 9 includes a current commutation block 916 that uses three-phase current commutation (for example) to generate the current command that is directed to each of the associated coils from the current commands of each coil unit. With this design, to measure the coil unit force constants of the targeted flexible mode, excitation signal at the resonance frequency of the targeted flexible mode may be injected to the coil unit current commands before 3-phase current commutation at block 916.

With this design, under stage feedback control of rigid-body axes, a single-frequency excitation signal at a resonance frequency of a targeted flexible mode is injected from block 910 to the current command of interested coil units one by one. Meanwhile the notch filter 902 at the injected frequency is applied to every feedback control loop of six rigid body axes to avoid the interference of feedback control on the flexible mode sensor outputs measured at block 912. For each targeted flexible mode, the measurement is conducted at all the interested XY positions. For each targeted flexible mode, when its corresponding flexible mode force constant is being experimentally determined, the stage mover assembly is momentarily controlled to maintain the stage in a levitated (along the Z axis) position with a constant position along the X, Y, and Z axes, and about the X, Y, and Z axes. Subsequently, the X-Y position of the stage is changed and the process is repeated.

More specifically, for a first targeted flexible mode, (i) the stage is controlled to be levitated at a first X-Y position relative to the conductor assembly; (ii) the corresponding first resonance frequency is injected into a first coil unit at block 910; (iii) the notch filter 902 is set to filter out the first resonance frequency; and (iv) the flexible mode sensor outputs are measured at block 912. Next, for the first targeted flexible mode, (i) the stage is controlled to be levitated at the first X-Y position; (ii) the corresponding first resonance frequency is injected into a second coil unit (different than the first coil unit) at block 910; (iii) the notch filter 902 is set to filter out the first resonance frequency; and (iv) the flexible mode sensor outputs are measured at block 912. For the first targeted flexible mode, this process is repeated for the each of the individual coil units at the first X-Y position. Subsequently, for the first targeted flexible mode, the entire process can be repeated for each of the individual coil units of the conductor assembly at a second X-Y position (that is different from the first X-Y position). Next, for the first targeted flexible mode, the entire process can be repeated for each of the individual coil units of the conductor assembly for each of the different X-Y positions to generate the corresponding flexible mode force constants.

Similarly, for a second targeted flexible mode, (i) the stage is controlled to be levitated at a first X-Y position relative to the conductor assembly; (ii) the corresponding second resonance frequency is injected into the first coil unit at block 910; (iii) the notch filter 902 is set to filter out the second resonance frequency; and (iv) the flexible mode sensor outputs are measured at block 912. Next, for the second targeted flexible mode, (i) the stage is controlled to be levitated at the first X-Y position; (ii) the corresponding second resonance frequency is injected into the second coil unit at block 910; (iii) the notch filter 902 is set to filter out the first resonance frequency; and (iv) the flexible mode sensor outputs are measured at block 912. For the second targeted flexible mode, this process is repeated for the each of the individual coil units at the first X-Y position. Subsequently, for the second targeted flexible mode, the entire process can be repeated for each of the individual coil units of the conductor assembly at a second X-Y position (that is different from the first X-Y position). Next, for the second targeted flexible mode, the entire process can be repeated for each of the individual coil units of the conductor assembly for each of the different X-Y positions to generate the corresponding flexible mode constants.

It should be noted that these processes can also be repeated each of the other targeted flexible modes.

Figure 10:
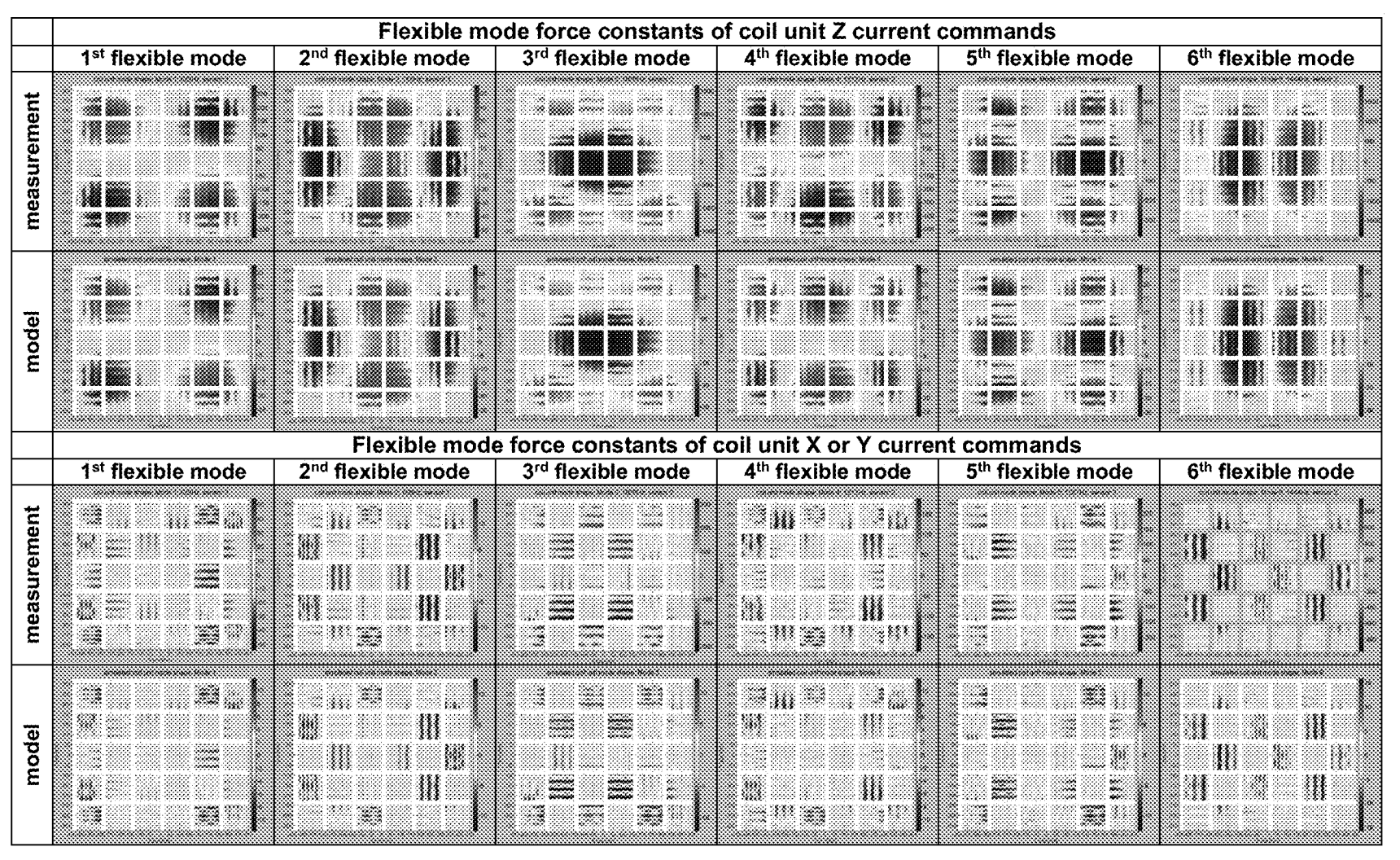

FIG. 10 includes a top row of graphs that illustrate (i) the measured flexible mode force constants of coil unit Z current commands for a first flexible mode, (ii) the measured flexible mode force constants of coil unit Z current commands for a second flexible mode, (iii) the measured flexible mode force constants of coil unit Z current commands for a third flexible mode, (iv) the measured flexible mode force constants of coil unit Z current commands for a fourth flexible mode, (v) the measured flexible mode force constants of coil unit Z current commands for a fifth flexible mode, and (vi) the measured flexible mode force constants of coil unit Z current commands for a sixth flexible mode. Additionally, FIG. 10 includes a second row from the top of graphs that illustrate (i) the modeled flexible mode force constants of coil unit Z current commands for a first flexible mode, (ii) the modeled flexible mode force constants of coil unit Z current commands for a second flexible mode, (iii) the modeled flexible mode force constants of coil unit Z current commands for a third flexible mode, (iv) the modeled flexible mode force constants of coil unit Z current commands for a fourth flexible mode, (v) the modeled flexible mode force constants of coil unit Z current commands for a fifth flexible mode, and (vi) the modeled flexible mode force constants of coil unit Z current commands for a sixth flexible mode.

Moreover, FIG. 10 includes a third from the top row of graphs that illustrate (i) the measured flexible mode force constants of coil unit X and Y current commands for a first flexible mode, (ii) the measured flexible mode force constants of coil unit X and Y current commands for a second flexible mode, (iii) the measured flexible mode force constants of coil unit X and Y current commands for a third flexible mode, (iv) the measured flexible mode force constants of coil unit X and Y current commands for a fourth flexible mode, (v) the measured flexible mode force constants of coil unit X and Y current commands for a fifth flexible mode, and (vi) the measured flexible mode force constants of coil unit X and Y current commands for a sixth flexible mode. Additionally, FIG. 10 includes a bottom row of graphs that illustrate (i) the modeled flexible mode force constants of coil unit X and Y current commands for a first flexible mode, (ii) the modeled flexible mode force constants of coil unit X and Y current commands for a second flexible mode, (iii) the modeled flexible mode force constants of coil unit X and Y current commands for a third flexible mode, (iv) the modeled flexible mode force constants of coil unit X and Y current commands for a fourth flexible mode, (v) the modeled flexible mode force constants of coil unit X and Y current commands for a fifth flexible mode, and (vi) the modeled flexible mode force constants of coil unit X and Y current commands for a sixth flexible mode.

It should be noted that during the determination of each of the flexible mode force constants, each coil unit will have either an X and Z current command or a Y and Z current command. For each coil unit, the excitations to X and Z (or Y and Z) are injected sequentially (individually) to measure their associated flexible mode force constants.

As illustrated in FIG. 10, very similar patterns appear in the measured and modeled coil unit flexible mode force constants. Scaling differences between two data sets are due to sensor scaling and can be absorbed into the control gain later.

After the flexible mode force constants are determined (either measured or modeled) the control system can control the stage mover assembly 16 in a fashion that inhibits the excitation of one or more targeted flexible modes. It should be noted that if the first flexible mode is a targeted flexible mode, then the corresponding flexible mode force constants are used by the control system to direct current to the coils in a fashion that suppresses the motion of the first flexible mode. Similarly, if the second flexible mode is a targeted flexible mode, then the corresponding flexible mode force constants are used by the control system to direct current to the coils in a fashion that suppresses the motion of the second flexible mode. The same can be said for the other flexible modes if is desired to control them.

Figure 11:
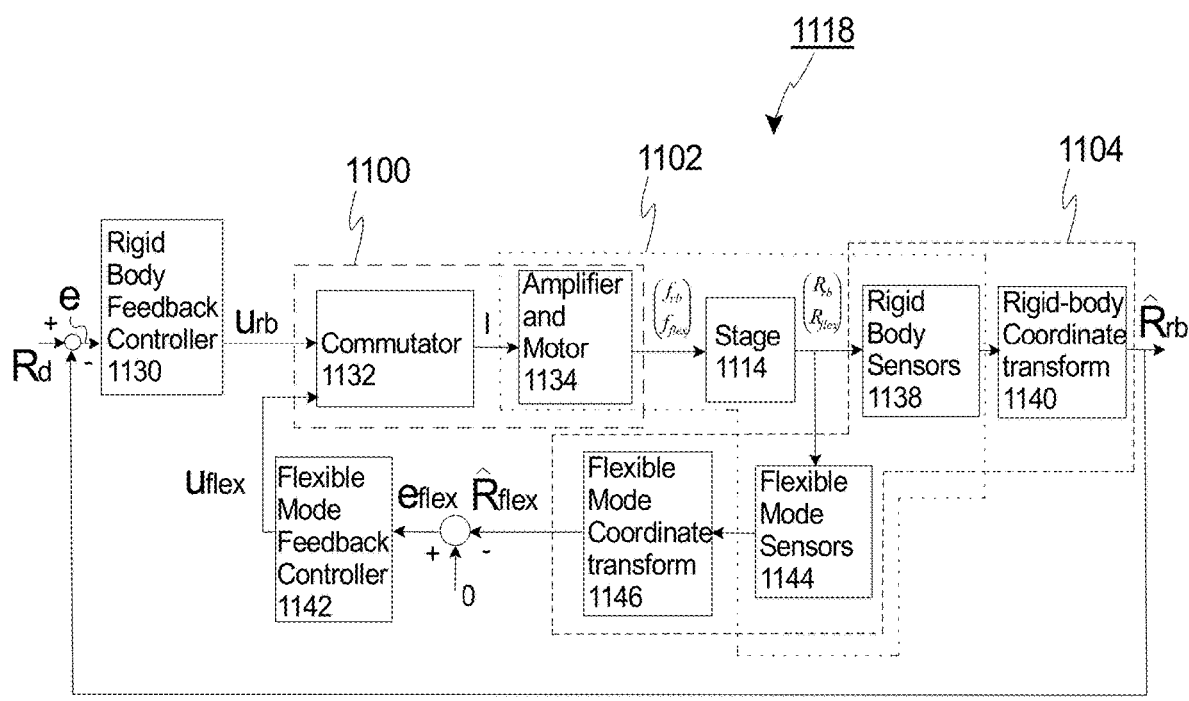
FIG. 11 is a control block diagram that can be used to control a stage mover assembly with control of both the rigid body modes and a targeted flexible mode.

FIG. 11 is a simplified control block diagram of the control system 1118 that can be used to control the planar motor stage mover assembly 16 (illustrated in FIG. 1) to precisely position the device 15 (illustrated in FIG. 1) with control of both the rigid body modes and one or more targeted flexible modes for the stage 15. In this embodiment, the block diagram includes (i) input decoupling 1100 (illustrated with long dashed enclosure); (ii) a physical plant 1102 (illustrated with dotted enclosure, and (iii) an output decoupling 1104. It should be noted that the control block diagram 1118 could be designed to include other features. Non-exclusive examples of additional features include feedforward control and iterative learning control.

In certain embodiments, the control system 1118 directs current to the stage mover assembly 16 (illustrated in FIG. 1) in a fashion that reduces the influence of one or more of the flexible body modes of interest ("target flexible body modes") for the stage 14 (illustrated in FIG. 1).

In FIG. 11, the control system 1118 includes (i) a rigid body feedback controller 1130 ("$C_{rb}(s)$"), e.g. a Proportional-Integral-Derivative ("PID") feedback controller that combines proportional control, integral control and derivative control in parallel; (ii) a commutator 1132 that can use a current distribution matrix ("$A_w^+$") that uses pseudo inverse commutation; (iii) amplifiers and the motor 1134 that can use a motor force actuation matrix ("$A_w$"), which generates rigid body and flexible mode forces and is referred to as PM Actuation that provides an inverse of the current distribution, (iv) the stage 1114 ("$P(s)$"), otherwise referred to as a plant or stage dynamics; (v) rigid body sensors 1138; (vi) rigid-body coordinate transform 1140; (vii) a flexible mode feedback controller 1142 ("$C_{flex}(s)$"), e.g. a Proportional-Derivative ("PD") feedback controller; (viii) flexible mode sensors 1144; and (ix) flexible mode coordinate transform 1146 that transforms (e.g. synthesizes) the signals from the flexible mode sensors 1144 (e.g. the flexible mode coordinate transform 1146 can use the signals from the multiple flexible mode sensors 1144 to better determine the flexible mode displacements from the different targeted flexible modes). With this design, the flexible mode feedback controller 1142 can be used to reduce the flexible mode excitations of the targeted flexible modes. Stated in another fashion, the flexible mode feedback controller 1142 can be used to compensate for residual flexible mode vibrations due to disturbance forces and force distribution errors. The flexible mode feedback controller 1142 is discussed in more detail with reference to FIGS. 13 and 14.

One, non-exclusive example of (i) a current distribution matrix ("$A_w^+$") for the commutator 1132, and (ii) a motor force actuation matrix ("$A_w$") for the amplifiers and the motor 1134 are described in more detail below.

For coil based motor control, motor force actuation may be described by the actuation matrix as follows:

$$\underbrace{\underset{\substack{\text{actuation} \\ \text{matrix} \\ (6+m) \times n}}{A} \cdot \underset{\substack{\text{current} \\ \text{weighting} \\ \text{matrix}, n \times n}}{W}}_{A_w: (6+m) \times n} \cdot \underset{\substack{\text{coil} \\ \text{current} \\ \text{cmd vector} \\ n \times 1}}{I} = \underset{\substack{\text{motor} \\ \text{force cmd} \\ \text{vector} \\ (6+m) \times 1}}{u} \quad \text{Equation (2)}$$

In Equation 2 and elsewhere, (i) A is the actuation matrix; (ii) W is the current weighting matrix; (iii) I is the coil current command vector; (iv) u is the motor force command vector; and (v) $A_w=A*W$. Each column of the actuation matrix ("A") consists of force constants "$k_F$" of 6 rigid body axes x, y, z, tx (about the x axis), ty (about the y axis), tz (about the Z axis) for each coil, and force constant vector ("$\varphi$") of the targeted flexible modes 1, 2, . . . m for the current command of coils 1, 2, 3, . . . n. This can be expressed as follows:

$$A = \begin{pmatrix} k_{Fx,1} & k_{Fx,2} & k_{Fx,3} & \cdots & k_{Fx,n} \\ k_{Fy,1} & k_{Fy,2} & k_{Fy,3} & \cdots & k_{Fy,n} \\ k_{Fz,1} & k_{Fz,2} & k_{Fz,3} & \cdots & k_{Fz,n} \\ k_{Ftx,1} & k_{Ftx,2} & k_{Ftx,3} & \cdots & k_{Ftx,n} \\ k_{Fty,1} & k_{Fty,2} & k_{Fty,3} & \cdots & k_{Fty,n} \\ k_{Ftz,1} & k_{Ftz,2} & k_{Ftz,3} & \cdots & k_{Ftz,n} \\ \varphi_{1,1} & \varphi_{1,2} & \varphi_{1,3} & \cdots & \varphi_{1,n} \\ \varphi_{2,1} & \varphi_{2,2} & \varphi_{2,3} & \cdots & \varphi_{2,n} \\ \vdots & \vdots & \vdots & \cdots & \vdots \\ \varphi_{m,1} & \varphi_{m,2} & \varphi_{m,3} & \cdots & \varphi_{m,n} \end{pmatrix} \quad \text{Equation (3)}$$

For example, (i) $k_{FX,1}$ is the force constant along the X axis for coil 1; (ii) $k_{Ftz,3}$ is the force constant about the Z axis for coil 3; (iii) $\varphi_{1,1}$ is the force constant vector for the first targeted flexible mode at coil 1; and (iv) $\varphi_{2,3}$ is the force constant vector for the second targeted flexible mode at coil 3. The other force constants and force constant vectors are expressed in a similar fashion.

The diagonal terms of weighting matrix ("W") consists of weighting factors for the current commands of coils 1, 2, 3 . . . n . . . , which are used to gradually reduce the current magnitudes when the associated coils are departing from the magnet array. The weighting matrix can be expressed as follows:

$$W = \begin{pmatrix} w_1 & 0 & 0 & \cdots & 0 \\ 0 & w_2 & 0 & \cdots & 0 \\ 0 & 0 & w_3 & \cdots & 0 \\ \vdots & \vdots & \vdots & \ddots & \vdots \\ 0 & 0 & 0 & \cdots & w_n \end{pmatrix} \quad \text{Equation (4)}$$

In Equation (4), for example $w_1$ is the weight for the first coil, and $w_2$ is the weight for the second coil. The weights of the other coils are expressed in a similar fashion.

The weighted actuation matrix then may be calculated as follows:

$$A_w = \begin{pmatrix} k_{Fx,1}W_1 & k_{Fx,2}W_2 & k_{Fx,3}W_3 & \cdots & k_{Fx,n}W_n \\ k_{Fy,1}W_1 & k_{Fy,2}W_2 & k_{Fy,3}W_3 & \cdots & k_{Fy,n}W_n \\ k_{Fz,1}W_1 & k_{Fz,2}W_2 & k_{Fz,3}W_3 & \cdots & k_{Fz,n}W_n \\ k_{Ftx,1}W_1 & k_{Ftx,2}W_2 & k_{Ftx,3}W_3 & \cdots & k_{Ftx,n}W_n \\ k_{Fty,1}W_1 & k_{Fty,2}W_2 & k_{Fty,3}W_3 & \cdots & k_{Fty,n}W_n \\ k_{Ftz,1}W_1 & k_{Ftz,2}W_2 & k_{Ftz,3}W_3 & \cdots & k_{Ftz,n}W_n \\ \varphi_{1,1}W_1 & \varphi_{1,2}W_2 & \varphi_{1,3}W_3 & \cdots & \varphi_{1,n}W_n \\ \varphi_{2,1}W_1 & \varphi_{2,2}W_2 & \varphi_{2,3}W_3 & \cdots & \varphi_{2,n}W_n \\ \vdots & \vdots & \vdots & \cdots & \vdots \\ \varphi_{m,1}W_1 & \varphi_{m,2}W_2 & \varphi_{m,3}W_3 & \cdots & \varphi_{m,n}W_n \end{pmatrix} \quad \text{Equation (5)}$$

The current command vector consists of current commands of coils 1, 2, 3, . . . n, as expressed below:

$$I = \begin{pmatrix} i_1 \\ i_2 \\ i_3 \\ \vdots \\ i_n \end{pmatrix} \quad \text{Equation (6)}$$

In Equation (6), for example, $i_1$ is the current to the first coil, and $i_2$ is the current to the second coil. The other currents are expressed in a similar fashion.

The motor force command vector consists of motor force commands for six rigid body axes x, y, z, tx, ty, tz and interested flexible modes, 1, 2, . . . , m, as expressed below:

$$u = \begin{pmatrix} u_x \\ u_y \\ u_z \\ u_{tx} \\ u_{ty} \\ u_{tz} \\ u_{V_1} \\ u_{V_2} \\ \vdots \\ u_{V_m} \end{pmatrix} \quad \text{Equation (7)}$$

Moreover, in Equation (7), for example, (i) $u_x$ is the X axis control force command; (ii) $u_y$ is the Y axis control force command; (iii) $u_z$ is the Z axis control force command; (iv) $u_{tx}$ is the theta X control force command; (v) $u_{ty}$ is the theta Y control force command; (vi) $u_{tz}$ is the theta Z control force command; (vii) $u_{V_1}$ is the flexible mode one control force command; (viii) $u_{V_2}$ is the flexible mode two control force command; and (ix) $u_{V_m}$ is the flexible mode "m" control force command.

The Pseudo-inverse of weighted actuation matrix $A_w^+$ is applied to convert the motor force command vector to coil current command vector as follows:

$$\underbrace{I}_{\substack{coil \\ current \\ cmd\ vector \\ n\times 1}} = \underbrace{A_w^+}_{\substack{pseudo-inverse \\ of\ weighted \\ actuation\ matrix \\ n\times(6+m)}} \cdot \underbrace{u}_{\substack{motor \\ force\ cmd \\ vector \\ (6+m)\times 1}} \quad \text{Equation (8)}$$

$$A_w^+ = \underbrace{A_w^T\ (A_w A_w^T)^{-1}}_{(6+m)\times(6+m)}. \quad \text{Equation (9)}$$

In Equation (9), $A_w^T$ is the matrix transpose of weighted actuation matrix.

The weighted coil current commands are then assigned to the associated amplifiers to direct currents to coils as follows:

$$\underbrace{I_w}_{\substack{\text{weighted coil} \\ \text{current} \\ \text{cmd vector} \\ n \times 1}} = W \cdot \underbrace{I}_{\substack{\text{coil} \\ \text{current} \\ \text{cmd vector} \\ n \times 1}} = \begin{pmatrix} w_1 i_1 \\ w_2 i_2 \\ w_3 i_3 \\ \vdots \\ w_n i_n \end{pmatrix}. \quad \text{Equation (10)}$$

The above Equations are directed to the embodiment in which current to each coil can be independently controlled. Similarly, the motor control equations can be generated for the embodiment where current to each coil unit is individually controlled. More specifically, the motor force actuation for coil unit based motor control may be described by the following equation:

$$\underbrace{\underbrace{A}_{\substack{\text{actuation} \\ \text{matrix} \\ (6+m) \times 2n}} \cdot \underbrace{W}_{\substack{\text{current} \\ \text{weighting} \\ \text{matrix}, 2n \times 2n}}}_{A_W: (6+m) \times 2n} \cdot \underbrace{I}_{\substack{\text{coil unit} \\ \text{current} \\ \text{cmd vector} \\ 2n \times 1}} = \underbrace{u}_{\substack{\text{motor} \\ \text{force cmd} \\ \text{vector} \\ (6+m) \times 1}}. \quad \text{Equation (11)}$$

Each column of the actuation matrix ("A") consists of force constants of 6 rigid body axes x, y, z, tx, ty, tz and interested flexible modes 1, 2, . . . m for horizontal (x or y) or z command of coil units 1, 2, 3, . . . n.

$$A = \begin{pmatrix} k_{Fx,h1} & k_{Fx,h2} & k_{Fx,h3} & \cdots & k_{Fx,hn} & k_{Fx,z1} & k_{Fx,z2} & k_{Fx,z3} & \cdots & k_{Fx,zn} \\ k_{Fy,h1} & k_{Fy,h2} & k_{Fy,h3} & \cdots & k_{Fy,hn} & k_{Fy,z1} & k_{Fy,z2} & k_{Fy,z3} & \cdots & k_{Fy,zn} \\ k_{Fz,h1} & k_{Fz,h2} & k_{Fz,h3} & \cdots & k_{Fz,hn} & k_{Fz,z1} & k_{Fz,z2} & k_{Fz,z3} & \cdots & k_{Fz,zn} \\ k_{Ftx,h1} & k_{Ftx,h2} & k_{Ftx,h3} & \cdots & k_{Ftx,hn} & k_{Ftx,z1} & k_{Ftx,z2} & k_{Ftx,z3} & \cdots & k_{Ftx,zn} \\ k_{Fty,h1} & k_{Fty,h2} & k_{Fty,h3} & \cdots & k_{Fty,hn} & k_{Fty,z1} & k_{Fty,z2} & k_{Fty,z3} & \cdots & k_{Fty,zn} \\ k_{Ftz,h1} & k_{Ftz,h2} & k_{Ftz,h3} & \cdots & k_{Ftz,hn} & k_{Ftz,z1} & k_{Ftz,z2} & k_{Ftz,z3} & \cdots & k_{Ftz,zn} \\ \varphi_{1,h1} & \varphi_{1,h2} & \varphi_{1,h3} & \cdots & \varphi_{1,hn} & \varphi_{1,z1} & \varphi_{1,z2} & \varphi_{1,z3} & \cdots & \varphi_{1,zn} \\ \varphi_{2,h1} & \varphi_{2,h2} & \varphi_{2,h3} & \cdots & \varphi_{2,hn} & \varphi_{2,z1} & \varphi_{2,z2} & \varphi_{2,z3} & \cdots & \varphi_{2,zn} \\ \vdots & \vdots & \vdots & \cdots & \vdots & \vdots & \vdots & \vdots & \cdots & \vdots \\ \varphi_{m,h1} & \varphi_{m,h2} & \varphi_{m,h3} & \cdots & \underbrace{\varphi_{m,hn}}_{\substack{\text{force constant} \\ \text{vector for horizontal} \\ \text{current commandn}}} & \varphi_{m,z1} & \varphi_{m,z2} & \varphi_{m,z3} & \cdots & \underbrace{\varphi_{m,zn}}_{\substack{\text{force constant} \\ \text{vector for z} \\ \text{current commandn}}} \end{pmatrix} \quad \text{Equation (12)}$$

Diagonal terms of weighting matrix ("W") consists of weighting factors for the current commands of coil units 1, 2, 3 . . . n . . . , which are used to gradually reduce the current magnitudes when the associated coil units are departing from the magnet array.

$$W = \begin{pmatrix} w_1 & 0 & 0 & \cdots & 0 & 0 & 0 & 0 & \cdots & 0 \\ 0 & w_2 & 0 & \cdots & 0 & 0 & 0 & 0 & \cdots & 0 \\ 0 & 0 & w_3 & \cdots & 0 & 0 & 0 & 0 & \cdots & 0 \\ \vdots & \vdots & \vdots & \ddots & \vdots & \vdots & \vdots & \vdots & \cdots & \vdots \\ 0 & 0 & 0 & \cdots & w_n & 0 & 0 & 0 & \cdots & 0 \\ 0 & 0 & 0 & \cdots & 0 & w_1 & 0 & 0 & \cdots & 0 \\ 0 & 0 & 0 & \cdots & 0 & 0 & w_2 & 0 & \cdots & 0 \\ 0 & 0 & 0 & \cdots & 0 & 0 & 0 & w_3 & \cdots & 0 \\ \vdots & \vdots & \vdots & \cdots & \vdots & \vdots & \vdots & \vdots & \ddots & 0 \\ 0 & 0 & 0 & \cdots & 0 & 0 & 0 & 0 & \cdots & w_n \end{pmatrix} \quad \text{Equation (13)}$$

The weighed actuation matrix then may be calculated as follows:

$$A_w = A \cdot W = \begin{pmatrix} k_{Fx,h1}w_1 & k_{Fx,h2}w_2 & k_{Fx,h3}w_3 & \cdots & k_{Fx,hn}w_n & k_{Fx,z1}w_1 & k_{Fx,z2}w_2 & k_{Fx,z3}w_3 & \cdots & k_{Fx,zn}w_n \\ k_{Fy,h1}w_1 & k_{Fy,h2}w_2 & k_{Fy,h3}w_3 & \cdots & k_{Fy,hn}w_n & k_{Fy,z1}w_1 & k_{Fy,z2}w_2 & k_{Fy,z3}w_3 & \cdots & k_{Fy,zn}w_n \\ k_{Fz,h1}w_1 & k_{Fz,h2}w_2 & k_{Fz,h3}w_3 & \cdots & k_{Fz,hn}w_n & k_{Fz,z1}w_1 & k_{Fz,z2}w_2 & k_{Fz,z3}w_3 & \cdots & k_{Fz,zn}w_n \\ k_{Ftx,h1}w_1 & k_{Ftx,h2}w_2 & k_{Ftx,h3}w_3 & \cdots & k_{Ftx,hn}w_n & k_{Ftx,z1}w_1 & k_{Ftx,z2}w_2 & k_{Ftx,z3}w_3 & \cdots & k_{Ftx,zn}w_n \\ k_{Fty,h1}w_1 & k_{Fty,h2}w_2 & k_{Fty,h3}w_3 & \cdots & k_{Fty,hn}w_n & k_{Fty,z1}w_1 & k_{Fty,z2}w_2 & k_{Fty,z3}w_3 & \cdots & k_{Fty,zn}w_n \\ k_{Ftz,h1}w_1 & k_{Ftz,h2}w_2 & k_{Ftz,h3}w_3 & \cdots & k_{Ftz,hn}w_n & k_{Ftz,z1}w_1 & k_{Ftz,z2}w_2 & k_{Ftz,z3}w_3 & \cdots & k_{Ftz,zn}w_n \\ \varphi_{1,h1}w_1 & \varphi_{1,h2}w_2 & \varphi_{1,h3}w_3 & \cdots & \varphi_{1,hn}w_n & \varphi_{1,z1}w_1 & \varphi_{1,z2}w_2 & \varphi_{1,z3}w_3 & \cdots & \varphi_{1,zn}w_n \\ \varphi_{2,h1}w_1 & \varphi_{2,h2}w_2 & \varphi_{2,h3}w_3 & \cdots & \varphi_{2,hn}w_n & \varphi_{2,z1}w_1 & \varphi_{2,z2}w_2 & \varphi_{2,z3}w_3 & \cdots & \varphi_{2,zn}w_n \\ \vdots & \vdots & \vdots & \cdots & \vdots & \vdots & \vdots & \vdots & \cdots & \vdots \\ \varphi_{m,h1}w_1 & \varphi_{m,h2}w_2 & \varphi_{m,h3}w_3 & \cdots & \varphi_{m,hn}w_n & \varphi_{m,z1}w_1 & \varphi_{m,z2}w_2 & \varphi_{m,z3}w_3 & \cdots & \varphi_{m,zn}w_n \end{pmatrix}$$

Equation (14)

The current command vector consists of horizontal (x or y) and z current commands of coil units 1, 2, 3, . . . n as follows:

$$I = \begin{pmatrix} i_{h1} \\ i_{h2} \\ i_{h3} \\ \vdots \\ i_{hn} \\ i_{z1} \\ i_{z2} \\ i_{z3} \\ \vdots \\ i_{zn} \end{pmatrix}$$

Equation (15)

The force command vector consists of force commands for six rigid body axes, x, y, z, tx, ty, tz and the interested flexible modes, 1, 2, . . . m can be expressed as follows:

$$u = \begin{pmatrix} u_x \\ u_y \\ u_z \\ u_{tx} \\ u_{ty} \\ u_{tz} \\ u_{v_1} \\ u_{v_2} \\ \vdots \\ u_{v_m} \end{pmatrix}$$

Equation (16)

The pseudo-inverse of weighted actuation matrix $A_w^+$ is applied to convert the force command vector to coil unit current command vector as follows:

$$\underbrace{I}_{\substack{\text{coil unit} \\ \text{current} \\ \text{cmd vector} \\ 2n \times 1}} = \underbrace{A_w^+}_{\substack{\text{pseudo-inverse} \\ \text{of weighted} \\ \text{actuation matrix} \\ 2n \times (6+m)}} \cdot \underbrace{u}_{\substack{\text{motor} \\ \text{force cmd} \\ \text{vector} \\ (6+m) \times 1}}$$

Equation (17)

-continued $$A_w^+ = A_w^T \underbrace{(A_w A_w^T)^{-1}}_{(6+m) \times (6+m)}.$$

Equation (18)

The weighted coil unit current commands are then assigned to the associated coil units, which are then converted to current commands of individual phases by 3-phase commutations as follows:

$$I_w = W \cdot I = \begin{pmatrix} w_1 i_{h1} \\ w_2 i_{h2} \\ w_3 i_{h3} \\ \vdots \\ w_n i_{hn} \\ w_1 i_{z1} \\ w_2 i_{z2} \\ w_3 i_{z3} \\ \vdots \\ w_n i_{zn} \end{pmatrix}$$

Equation (19)

For instance, sine and cosine functions may be used in the 3-phase commutation to convert the weighted horizontal (x or y) and z current commands of coil unit k to current commands of the associated three coil phases as follows:

$$\begin{pmatrix} i_{uk} \\ i_{vk} \\ i_{wk} \end{pmatrix} = \begin{pmatrix} \sin\left(\theta_k - \frac{4\pi}{3}\right) & -\cos\left(\theta_k - \frac{4\pi}{3}\right) \\ \sin\theta_k & -\cos\theta_k \\ \sin\left(\theta_k + \frac{4\pi}{3}\right) & -\cos\left(\theta_k + \frac{4\pi}{3}\right) \end{pmatrix} \cdot \begin{pmatrix} w_k i_{hk} \\ w_k i_{zk} \end{pmatrix}.$$

Equation (20)

In Equation 20, $\theta_k$ is the commutation phase of coil unit k.

Further, in FIG. 11 (i) "$R_d$" represents a desired reference position, e.g. the desired trajectory (along the X, Y, and Z axes, and about the X, Y, and Z axes) of the stage 14 (or device 15) at a particular moment in time; (ii) "$R_{rb}$" represents actual momentary, positions (six degree of freedom, e.g. along the X, Y, and Z axes, and about the X, Y, and Z axes) of the stage 14 (or device 15) to be measured by the rigid body sensors 1138 at a particular moment in time; (iii)

"$\hat{R}_{rb}$" represents a transformed, measured, actual momentary, position (six degree of freedom, e.g. along the X, Y, and Z axes, and about the X, Y, and Z axes) of the rigid body stage 1114 as measured by the rigid body sensors 1138 at a particular moment in time; (iv) "$R_{flex}$" represents actual momentary, displacements of the stage 1114 caused by the flexible modes to be measured by the flexible mode sensors 1144 at a particular moment in time; (v) "$\hat{R}_{flex}$" represents a transformed, measured, actual momentary, displacements of the flexible modes of the stage 1114; (vi) "e" represents a rigid body following error (along the X, Y, and Z axes, and about the X, Y, and Z axes) of the stage 1114, e.g. the error between the desired position "$R_d$" and the transformed measured output position "$\hat{R}_{rb}$" of the stage 1114 (or device 15) at a particular moment in time; and (vii) "$e_{flex}$" represents a flexible mode following error of the stage 1114, e.g. the error between the desired displacement of zero and the transformed measured displacement "$\hat{R}_{flex}$".

In FIG. 11, starting at the left side of the control block diagram, the desired trajectory "$R_d$" is fed into the control system 1118 along with the transformed measured rigid body position "$\hat{R}_{rb}$" of the stage 1114. Next, the control system 1118 sums the desired trajectory "$\hat{R}_d$" and the transformed measured rigid body position "$\hat{R}_{rb}$" to determine the following error "e" of the rigid body of the stage 1114. Subsequently, the following error "e" is fed into a rigid body feedback controller 1130. The feedback controller 1130 determines the rigid body forces $u_{rb}$ ("rigid body force commands") along and about the X, Y and/or Z axes that are necessary to correct the following error "e" of the stage 1114 to the desired trajectory "$R_d$" using the stage mover assembly 16. The rigid body force command $u_{rb}$ includes (i) an X axis force command ($u_x$); (ii) a Y axis force command ($u_y$); (iii) a Z axis force command ($u_z$); (iv) a theta X axis force command ($u_{tx}$); (v) a theta Y axis force command ($u_{ty}$); and (vi) a theta Z axis force command ($u_{tz}$).

Somewhat similarly, the transformed measured flexible mode displacement "$\hat{R}_{flex}$" of the stage 1114 is subtracted from zero (desired displacement of the flexible modes) to determine the flexible mode following error "$e_{flex}$" of the stage 1136. Subsequently, the flexible mode following error "$e_{flex}$" is fed into a flexible mode feedback controller 1142. The flexible mode feedback controller 1142 determines the flexible mode forces $u_{flex}$ ("flexible body force commands") for the associated degrees of freedom (each flexible mode is an independent degree of freedom) that are necessary to correct the flexible mode following error "$e_{flex}$" of the stage. The flexible mode force commands $u_{flex}$ can include (i) a flexible mode one control force command ($u_{v1}$); (ii) a flexible mode two control force command ($u_{v2}$); (iii) a flexible mode three control force command ($u_{v3}$); and (iv) a separate flexible mode control force command for each mode that is being controlled.

Next, the rigid body force commands $u_{rb}$ and the flexible body force commands $u_{flex}$ are sent to the commutator 1132 which utilizes motor commutations to determine the current commands "I" necessary to move the stage 536 and to suppress the motion of the targeted flexible modes. In one embodiment, the commutation formula is a pseudo inverse commutation formula.

The current commands "I" are directed to the motor amplifier 1134 which directs current to the coils 24, 26 (illustrated in FIG. 1) to generate forces "f" on the stage 1136 that includes rigid body forces "$f_{rb}$", and flexible mode forces "$f_{flex}$". Depending on the forces generated, the forces can move the stage 1114 and control the flexible modes of the stage 1114. As provided above, the rigid body sensors 1138 are expected to measure the displacement of the stage 1114 that includes both the rigid body position and the flexible mode displacement of the stage. Further, flexible mode sensors are expected to measure the displacement $R_{flex}$ of the flexible modes of the stage. In certain embodiment, the present invention suppresses the flexible mode vibrations by flexible mode control so that the rigid body sensors only measure the rigid body positions.

Next, the rigid body displacement $R_{rb}$, is transformed with the rigid-body coordinate transform 1140 because one or more of the rigid body sensors 1138 do not measure at the center of gravity of the stage, to generate the transformed measured rigid body position "$\hat{R}_{rb}$". Similarly, the flexible body displacement $R_{flex}$, is transformed with the flexible mode coordinate transform 1146. Flexible mode displacement is defined by mode shapes. Each sensor may pick up more than one mode.

As provided herein, the commutation formula used by the commutator 1132 allows for the use (input coupling) of both the rigid body force commands $u_{rb}$, and flexible mode force commands $u_{flex}$. With this design, (i) the rigid body feedback controller 1130 and the flexible mode feedback controller 1142 are decoupled from each other; and (ii) the commutator 1132 receives the rigid body force commands from the rigid body feedback controller 1130, and the flexible mode force commands from the flexible mode feedback controller 1142. Thus, the commutation formula used by the commutator 1132 is able to decouple the force commands of rigid body modes and the force commands of the flexible modes. As a result thereof, this design allows for active flexible mode control of the flexible modes of the stage 1136 using the flexible mode feedback controller 1142. This improves the accuracy of positioning of the stage 1114.

In FIG. 11, (i) the input decoupling 1100 includes the commutator 1132 and the amplifiers & motor 1134 that allow for the use of (couples) both the rigid body force command $u_{rb}$, and a flexible mode force command $u_{flex}$; (ii) the physical plant 1102 includes the amplifiers and motor 1134, the stage 1114, the rigid body sensors 1138 and the flexible mode sensors 1144; and (iii) the output decoupling 1104 includes the sensors 1138, 1144 and the coordinate transforms 1140, 1146.

In summary, as illustrated by the control block diagram of FIG. 11, stage control may be extended from the six rigid-body axes to one or more targeted flexible modes. Input decoupling is executed through pseudo-inverse current distribution in the commutator 1132, using the coil or coil unit force constants of rigid-body and flexible modes. Output decoupling is conducted through allocation of the flexible mode sensors (to the joint of nodal lines of non-targeted modes) and the coordinate transform (if necessary). When the low-frequency contents of flexible mode sensors (such as accelerometer) are not so accurate, the associated flexible mode feedback control is focused on the damping enhancement around the corresponding resonance frequencies of the targeted flexible modes. A damping filter can be applied to the actively controlled mode with proper phase correction. Notch filters are frequently employed to further reduce the coupling from the control of targeted mode to other flexible modes at nearby frequencies.

Figure 12A:
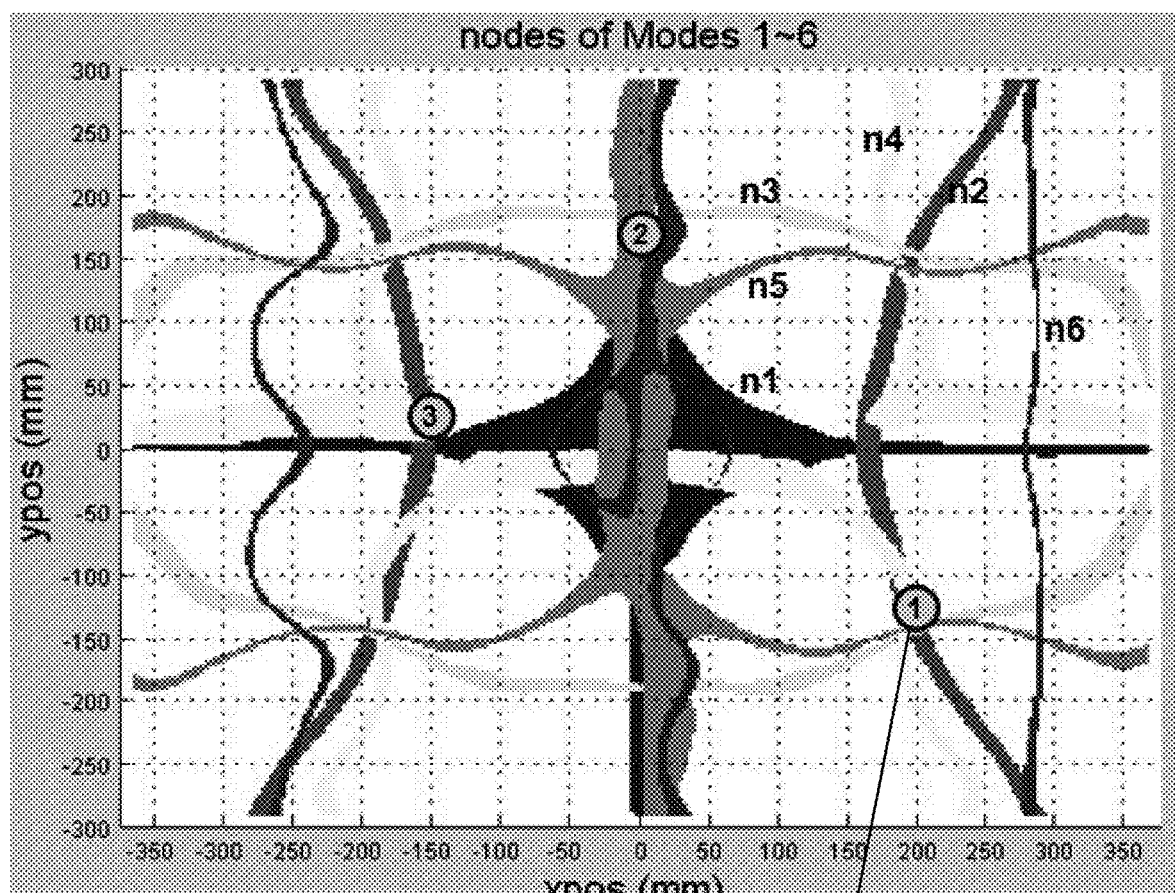
FIGS. 12A, 12B, and 12C are graphs that illustrate the nodal lines of a stage and three alternative flexible mode sensor locations.

FIG. 12A is a graph that illustrates the simulated nodal lines for the flexible mode one (n1), the flexible mode two (n2), the flexible mode three (n3), the flexible mode four (n4), the flexible mode five (n5), and the flexible mode six (n6). FIG. 12A also illustrates one suitable example of where the flexible mode sensors can be positioned on the stage to monitor the first flexible mode, the second flexible mode and the third flexible mode.

As provided herein, the location of the flexible move sensors 28 (each identified with a number enclosed in a circle) is selected based on the flexible mode shapes and the targeted flexible modes. In FIG. 12A, the targeted flexible modes are flexible mode one, flexible mode two, and flexible mode three. Further, the other flexible modes (e.g. four, five and six) are non-targeted flexible modes. The mode shapes at sensor location (top stage surface) determine sensor output magnitude for each mode. Output-decoupling may be achieved by proper sensor allocations. For instance, the flexible mode sensors 28 can be placed at joints of nodal lines of non-targeted flexible modes.

In FIG. 12A, (i) a first flexible mode sensor 28 (illustrated with a 1 enclosed in a circle) is located at the junction of the nodal lines of flexible modes 2, 4, and 5 to monitor targeted flexible mode one (at this location, motion is primarily caused by the flexible mode one, and very little motion caused by flexible modes 2, 4, and 5); (ii) a second flexible mode sensor 28 (illustrated with a 2 enclosed in a circle) is located at the junction of nodal lines of flexible modes 1, 3, 5, and 6 to monitor targeted flexible mode two (at this location, motion is primarily caused by the flexible mode two, and very little motion caused by flexible modes 1, 3, 5 and 6); and (iii) a third flexible mode sensor 28 (illustrated with a 3 enclosed in a circle) is located at the junction of nodal lines of flexible modes 1, 2 and 4 to monitor targeted flexible mode three (at this location, motion is primarily caused by the flexible mode three, and very little motion caused by flexible modes 1, 2, and 4). In this example, the stage includes three spaced apart flexible mode sensors 28 that are used to monitor targeted flexible modes one, two, and three.

It should be noted that there is very little displacement (approximately zero) caused by the respective flexible mode at its corresponding nodes. For example, (i) there is very little displacement caused by the first flexible mode at its nodes, (ii) there is very little displacement caused by the second flexible mode at its nodes, and etc. In certain embodiments, the flexible mode sensors 28 are positioned at locations where the nodes of two flexible modes intersect, because that there is very little displacement caused by those two flexible modes at these locations.

Figure 12B:
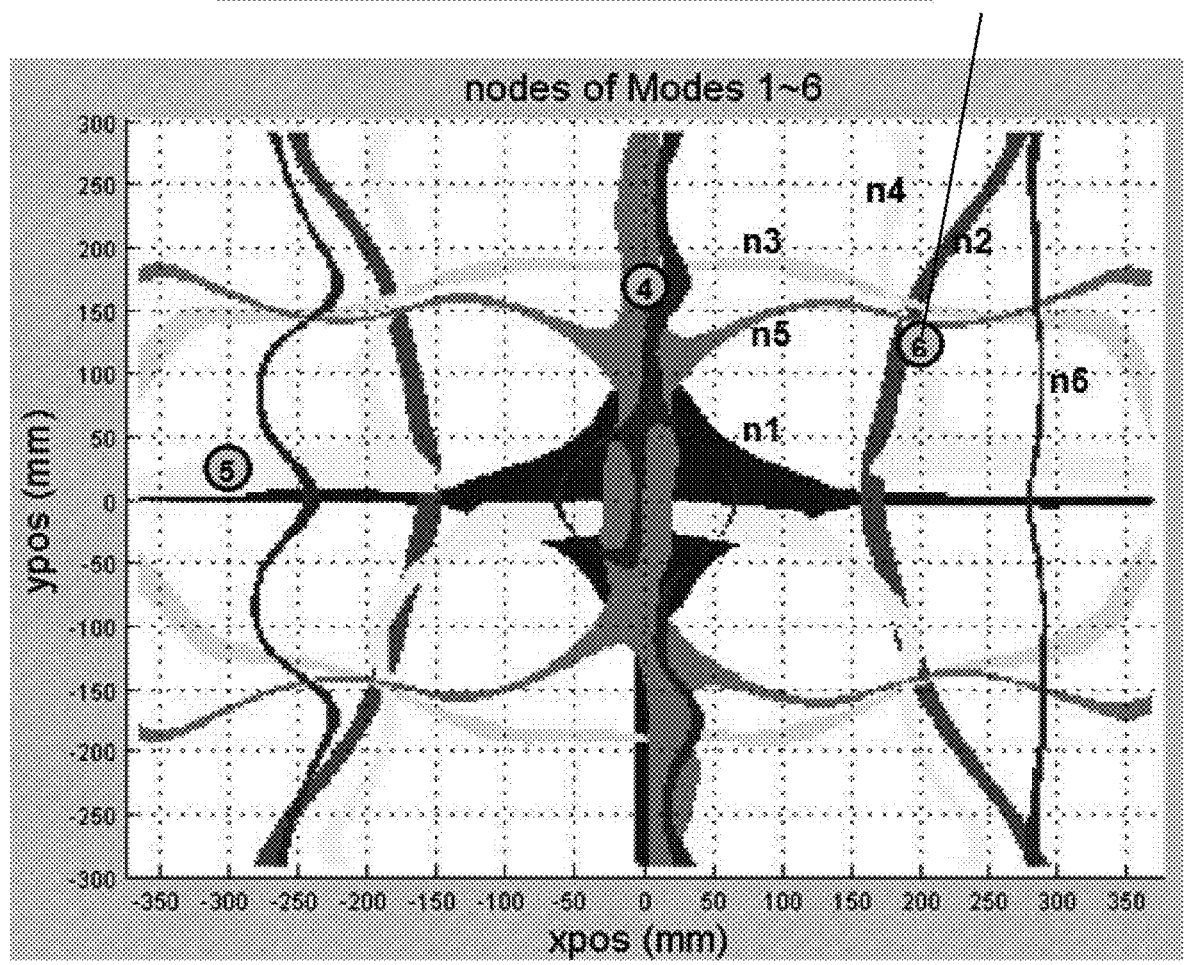

FIG. 12B is a graph that again illustrates the simulated nodal lines for the flexible mode one (n1), the flexible mode two (n2), the flexible mode three (n3), the flexible mode four (n4), the flexible mode five (n5), and the flexible mode six (n6). FIG. 12B also illustrates one suitable example of where the flexible mode sensors 28 can be positioned on the stage to monitor the flexible mode four, flexible mode five, and flexible mode six.

As provided herein, the location of the flexible mode sensors 28 (each identified with a number enclosed in a circle) is selected based on the flexible mode shapes and the targeted flexible modes. In FIG. 12B, (i) a fourth flexible mode sensor 28 (illustrated with a 4 enclosed in a circle) is located at the junction of the nodal lines of flexible modes 3, 5, and 6 to monitor targeted flexible mode four; (ii) a fifth flexible mode sensor 28 (illustrated with a 5 enclosed in a circle) is located at the junction of nodal lines of flexible modes 1 and 4 to monitor targeted flexible mode five; and (iii) a sixth flexible mode sensor 28 (illustrated with a 6 enclosed in a circle) is located at the junction of nodal lines of flexible modes 2, 3, 4, and 5 to monitor targeted flexible mode six. In this example, the stage includes three spaced apart flexible mode sensors 28 that are used to monitor targeted flexible modes four, five, and six. Further, in this example, flexible modes one, two and three are non-targeted flexible modes.

Figure 12C:
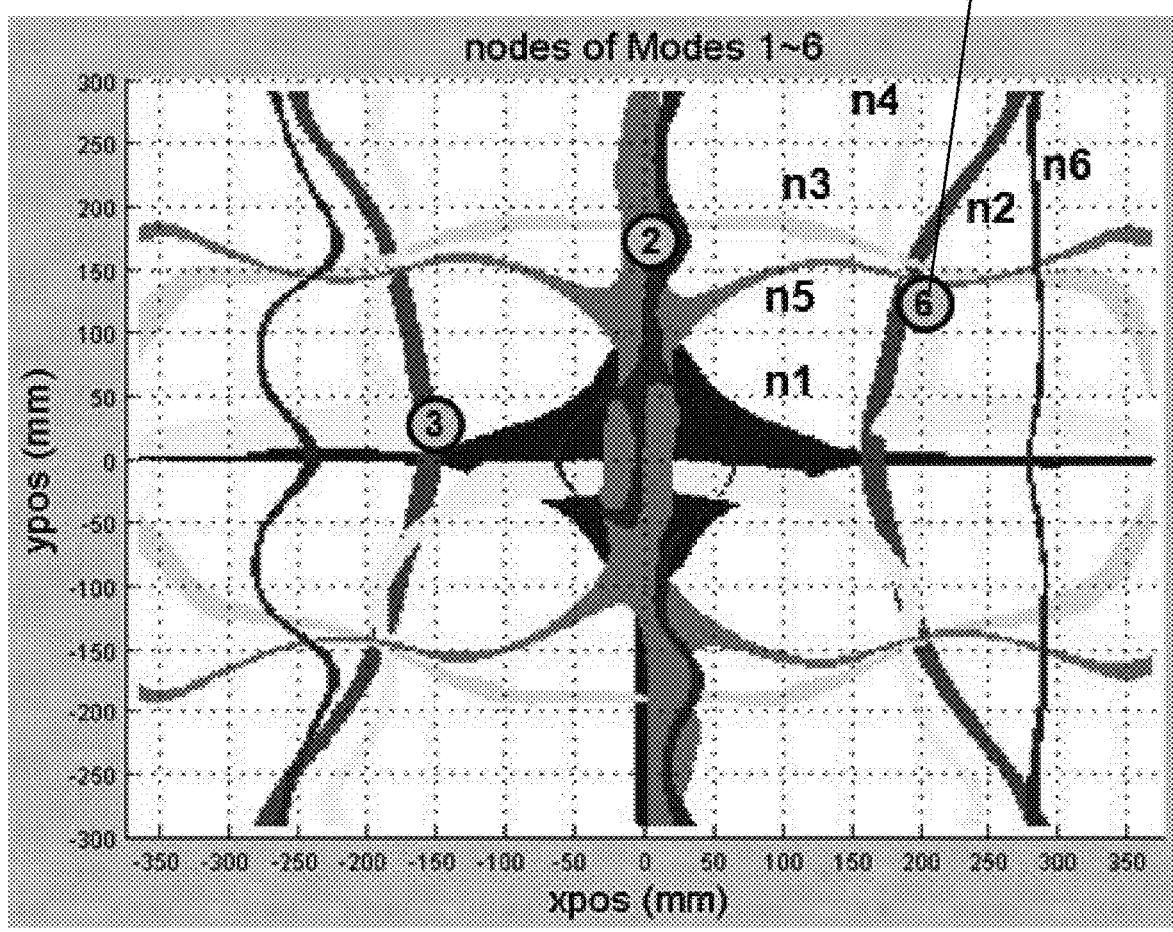

FIG. 12C is a graph that again illustrates the simulated nodal lines for the flexible mode one (n1), the flexible mode two (n2), the flexible mode three (n3), the flexible mode four (n4), the flexible mode five (n5), and the flexible mode six (n6). FIG. 12C also illustrates one suitable example of where the flexible mode sensors 28 can be positioned on the stage to monitor the flexible mode two, flexible mode three, and flexible mode six.

As provided herein, the location of the flexible move sensors 28 (each identified with a number enclosed in a circle) is selected based on the flexible mode shapes and the targeted flexible modes. In FIG. 12C, (i) a second flexible mode sensor 28 (illustrated with a 2 enclosed in a circle) is located at the junction of nodal lines of flexible modes 1, 3, 5, and 6 to monitor targeted flexible mode two; (ii) a third flexible mode sensor 28 (illustrated with a 3 enclosed in a circle) is located at the junction of nodal lines of flexible modes 1, 2 and 4 to monitor targeted flexible mode three; and (iii) a sixth flexible mode sensor 28 (illustrated with a 6 enclosed in a circle) is located at the junction of nodal lines of flexible modes 2, 3, 4, and 5 to monitor targeted flexible mode six.

With these designs, each flexible mode sensor 28 is located on a node or at an intersection of the nodes of two or more flexible modes to minimize the excitation caused by those flexible modes on the respective flexible mode sensor 28.

Thus, the location of the flexible mode sensors 28 can be selected to primarily pick up the vibration caused by the targeted flexible modes, while avoiding vibration caused by the non-targeted flexible modes.

It should be noted that the mode shapes of the flexible modes illustrated in FIGS. 12A-12C can be obtained from finite element analysis or directly identified and measured while testing the stage 14.

FIG. 13 is a block diagram that illustrates a non-exclusive, control loop for flexible mode damping control of the flexible mode feedback controller 1142 of FIG. 11. As provided herein, flexible mode damping control conducted with the block diagram of FIG. 13, includes damping filter, bandpass filters and notch filters. More specifically, the control loop illustrated in FIG. 13 includes (i) a damping filter ("$C_{damp}(s)$") 1300 that is used to suppress the vibrations of the targeted flexible mode; (ii) a bandpass filter ("$C_{bp}(s)$") 1302 that allow signal around the resonance frequency of targeted flexible mode to pass but attenuate signals at all the other frequencies; (iii) a notch filter ("$C_{notch}(s)$") 1304 that inhibits the control of targeted flexible mode from affecting the other modes; (iv) a current distribution block 1306 that distributes the control command of the targeted flexible mode to the current commands of coils or coil units; (v) a time delay block 1308 ("$e^{-t_d s}$") that represents input and output time delay of the system; (vi) an amplifier block 1310 ("$G_{amp}(s)$") that represents the physical characteristics of the amplifier; (vii) flexible modes of the stage referred to as ("$P_{flex}(s)$") 1312 that represents the physical characteristics of the stage flexible mode dynamics; (viii) the flexible mode sensor ("$G_{AccSens}(S)$") 1314 that provides sensor signals and represents the dynamics of the sensor; (ix) a coordinate transform block 1316 that uses (e.g. synthesizes) multiple signals from the flexible mode sensors; and (ix) a software filter ("$H_{AccToPos}(s)$") 1318 that transforms the accelerometer signal to position. Additionally in FIG. 13, d is a disturbance force.

It should be noted that FIG. 13 is a control block diagram for a single targeted flexible mode, and each additional targeted flexible mode will have a separate control block diagram similar to FIG. 13 with different filters tailored for the respective targeted flexible mode.

It should also be noted that the characteristics of the damping of the targeted flexible modes can be adjusted by adjusting the associated damping filter ("$C_{damp}(s)$") 1300.

In FIG. 13, starting at the left side of the control block diagram, the desired displacement of "0" is compared to the sensed displacement "y". The difference is fed to the damping filter ("$C_{damp}(s)$") 1300, the bandpass filter ("$C_{bp}(s)$") 1302, the notch filter ("$C_{notch}(s)$") 1304, the current distribution block 1306, the time delay block 1308 ("$e^{-t_d s}$"), and the amplifier block 1310 ("$G_{amp}(s)$") to direct current to the coils or coil units to reduce the amplification of one or more targeted flexible modes.

The closed-loop system stability requires proper phase correction of damping filter 1300 as provided in Equation (21) below, which takes overall phase of open-loop dynamics into consideration as described in Equation (3) below;

$$C_{damp}(s) = \frac{k_d \cdot (\cos\theta \cdot \omega_r s + \sin\theta \cdot \omega_r^2)}{\frac{s^2}{\omega_{lp}^2} + 2 \cdot \zeta_{lp} \cdot \frac{s}{\omega_{lp}} + 1} = \quad \text{Equation (21)}$$

$$k_d \cdot (\cos\theta \cdot \omega_r s + \sin\theta \cdot \omega_r^2) \cdot H_{LP}(s).$$

Alternatively, the damping filter 1300 may be also designed as follows;

$$C_{damp}(s) = \frac{k_d \cdot (-\sin\theta \cdot s^2 + \cos\theta \cdot \omega_r s)}{\frac{s^2}{\omega_{lp}^2} + 2 \cdot \zeta_{lp} \cdot \frac{s}{\omega_{lp}} + 1} = \quad \text{Equation (22)}$$

$$k_d \cdot (-\sin\theta \cdot s^2 + \cos\theta \cdot \omega_r s) \cdot H_{LP}(s).$$

In Equations (21) and (22):

$$H_{LP}(s) = \frac{1}{\frac{s^2}{\omega_{lp}^2} + 2 \cdot \zeta_{lp} \cdot \frac{s}{\omega_{lp}} + 1} \quad \text{Equation (23)}$$

$$\theta = \frac{\pi}{2} + \angle G_{OL}(j\omega_r) \text{ where } G_{OL}(s) = \frac{Y(s)}{U_{OL}(s)}.$$

In Equations (21), (22), (23), and elsewhere, (i) s is Laplace Transform variable; (ii) $k_d$ is a derivative control gain of the feedback controller; (iii) $\omega_r$ is the resonance frequency of the targeted flexible mode; (iv) $\omega_{LP}$ is the cut off frequency of the low pass filter; (v) $H_{LP}$ is a low pass filter; (vi) $G_{OL}$ is the transfer function of the open loop system; (vii) $U_{OL}$ is an open loop force command; (viii) Y is position measured by the flexible mode sensor; (ix) θ ("theta") is the correction phase and can be determined as provided below; and (x) $\zeta_{LP}$ is the damping ratio of the low pass filter.

Next, the correction phase of the damping filter ("$C_{damp}(s)$") 1300 needs to be determined. FIG. 14 is a non-exclusive control block diagram that can be used to determine (measure) the phase of the damping filter ("$C_{damp}(s)$") 1300 that needs to be added to the flexible mode control of FIG. 13 to attenuate the vibrations caused by the targeted flexible modes.

In FIG. 14, the block diagram includes (i) a low pass filter $H_{LP}$ 1400; (ii) a bandpass filter ("$C_{bp}(s)$") 1402; (iii) a notch filter ("$C_{notch}(s)$") 1404; (iv) a current distribution block 1406; (v) a system time delay block 1408 ("$e^{-t_d s}$") (vi) an amplifier block 1410 ("$G_{amp}(s)$"); (vii) flexible modes of the stage referred to as ("$P_{flex}(s)$") 1412; (viii) the flexible mode sensor ("$G_{AccSens}(s)$") 1414; (ix) a coordinate transform block 1416; and (ix) a software filter ("$H_{AccToPos}(s)$") 1418.

Most of the control blocks in FIG. 14 are the same as the corresponding named control blocks in FIG. 13. However, FIG. 14 is an open loop block diagram that includes a low pass filter $H_{LP}$ 1400 instead of damping filter ("$C_{damp}(s)$") 1300 of FIG. 13.

In FIG. 14, starting at the left side of the control block diagram, an open loop force command ("$u_{OL}$") is fed to the low pass filter $H_{LP}$ 1400, the bandpass filter ("$C_{bp}(s)$") 1402, the notch filter ("$C_{notch}(s)$") 1404, the current distribution block 1406, the time delay block 1408 ("$e^{-t_d s}$"), and the amplifier block 1410 ("$G_{amp}(s)$") to direct current to the coils or coil units to create an excitation force on the stage. The disturbance of the stage 1412 is detected by the flexible mode sensor ("$G_{AccSens}(s)$") 1414, and the sensors signals are transformed by the coordinate transform block 1416 and the software filter ("$H_{AccToPos}(s)$") 1418 to generate the displacement y.

It should be noted that the phase must be determined for each of the targeted flexible modes. For example, for first targeted flexible mode, an open loop excitation force command $u_{OL}$ (sinusoidal wave at the resonance first targeted flexible mode) is applied to control path in FIG. 14 and the resulting measured flexible mode displacement y is measured to determine the phase. Subsequently, for the second targeted flexible mode, a second open loop disturbance $u_{OL}$ (sinusoidal wave at the resonance frequency of second targeted flexible mode) is applied to control path in FIG. 14 and the resulting measured flexible mode displacement y is measured to determine the phase. This process is repeated for the other targeted flexible modes to individually determine the phase for each of the targeted flexible modes.

After input and output decoupling (illustrated in FIG. 11), every targeted flexible mode has its own closed-loop (FIG. 13) and open-loop (FIG. 14). Thus, the first targeted flexible mode will have its own control block diagram of FIG. 13 with filters tailored to the first targeted flexible mode, and its own open-loop control block diagram of FIG. 14 to determine the phase. Similarly, the second targeted flexible mode will have its own control block diagram of FIG. 13 with filters tailored to the second targeted flexible mode, and its own open-loop control block diagram of FIG. 14 to determine the phase. Further, the third targeted flexible mode will have its own control block diagram of FIG. 13 with filters tailored to the third targeted flexible mode, and its own open-loop control block diagram of FIG. 14 to determine the phase.

The phase of a mechanical resonance mode with small damping at resonance frequency is about −90 degrees.

$$\angle P_{flex}(j\omega_r) \approx -\frac{\pi}{2}. \quad \text{Equation (24)}$$

In Equation (24) and elsewhere, (i) $\angle P_{flex}(j\omega_r)$ is the phase of the flexible mode plant at the associated resonance frequency; and (ii) j is a square root of $-1$, $j=\sqrt{-1}$.

Ideally when no other part of system has phase lag, and no phase correction is needed. If there is no other phase lag then Equation (25) below can be utilized:
no other phase lag $$\text{no other phase lag} \Rightarrow \angle G_{OL}(j\omega_r) = \angle P_{flex}(j\omega_r) \Rightarrow \theta = \frac{\pi}{2} + \angle P_{flex}(j\omega_r) \approx 0. \quad \text{Equation (25)}$$

In Equation (5) and elsewhere (i) $\angle G_{OL}(j\omega_r)$ is the phase from the open loop transfer function; (ii) $\angle P_{flex}(j\omega_r)$ is the phase of the flexible mode plant at the associated resonance frequency.

In reality the system has other phase lags. In this situation, Equation (26) below can be utilized:

$$\theta = \frac{\pi}{2} + \angle G_{OL}(j\omega_r). \quad \text{Equation (26)}$$

As provided herein, the bandpass filter 1302 may be used in the feedback loop of targeted flexible modes to reduce force command drifting and noises (introduced by analog sensors) at low frequencies. A non-exclusive example of a suitable bandpass filter 1302 is provided in Equation (27) below:

$$C_{bp}(s) = \frac{2 \cdot d_{bp} \cdot \frac{s}{\omega_{bp}}}{\frac{s^2}{\omega_{bp}^2} + 2 \cdot d_{bp} \cdot \frac{s}{\omega_{sp}} + 1} \quad \text{Equation (27)}$$

In equation (27) and elsewhere, $d_{bp}$ is the damping ratio of bandpass filter; and $\omega_{bp}$ is bandpass frequency.

Since the damping control is effective only around the resonance frequency, a higher order bandpass filter 1302 as provided in Equation (28) may help to reduce the low frequency signal noise issues without much harm to the control performance.

$$C_{bp}(s) = \left( \frac{2 \cdot d_{bp} \cdot \frac{d}{\omega_{bp}}}{\frac{s^2}{\omega_{bp}^2} + 2 \cdot d_{bp} \cdot \frac{s}{\omega_{bp}} + 1} \right)^n, n = 1, 2, 3, \ldots \quad \text{Equation (28)}$$

In Equation (28), n is the order of the bandpass filter 1302. In certain embodiments, the higher bandpass filter order, the better low frequency performance recovery. However, for the prevention of the flexible mode closed-loop response distortion around the associated resonance frequency, the order of the bandpass filter 1302 cannot be too high. Thus, the bandpass filter 1302 can be adjusted to adjust the attenuation of the targeted flexible modes.

The flexible mode control on the stage can be implemented in a number of different fashions. For example, the number of targeted flexible modes controlled by the flexible mode control can vary. In alternative, non-exclusive embodiments, the flexible mode control can be designed to control 1, 2, 3, 4, 5, 6, or more targeted flexible modes concurrently.

The potential limitation to the number of flexible modes to be controlled is the real-time control software computation time and the memory size to store the motor force constant. The proposed active damping control methods may be applied to various combinations of concerned flexible modes. For demonstration purpose, three different combinations of targeted flexible modes are provided herein.

Figure 15:
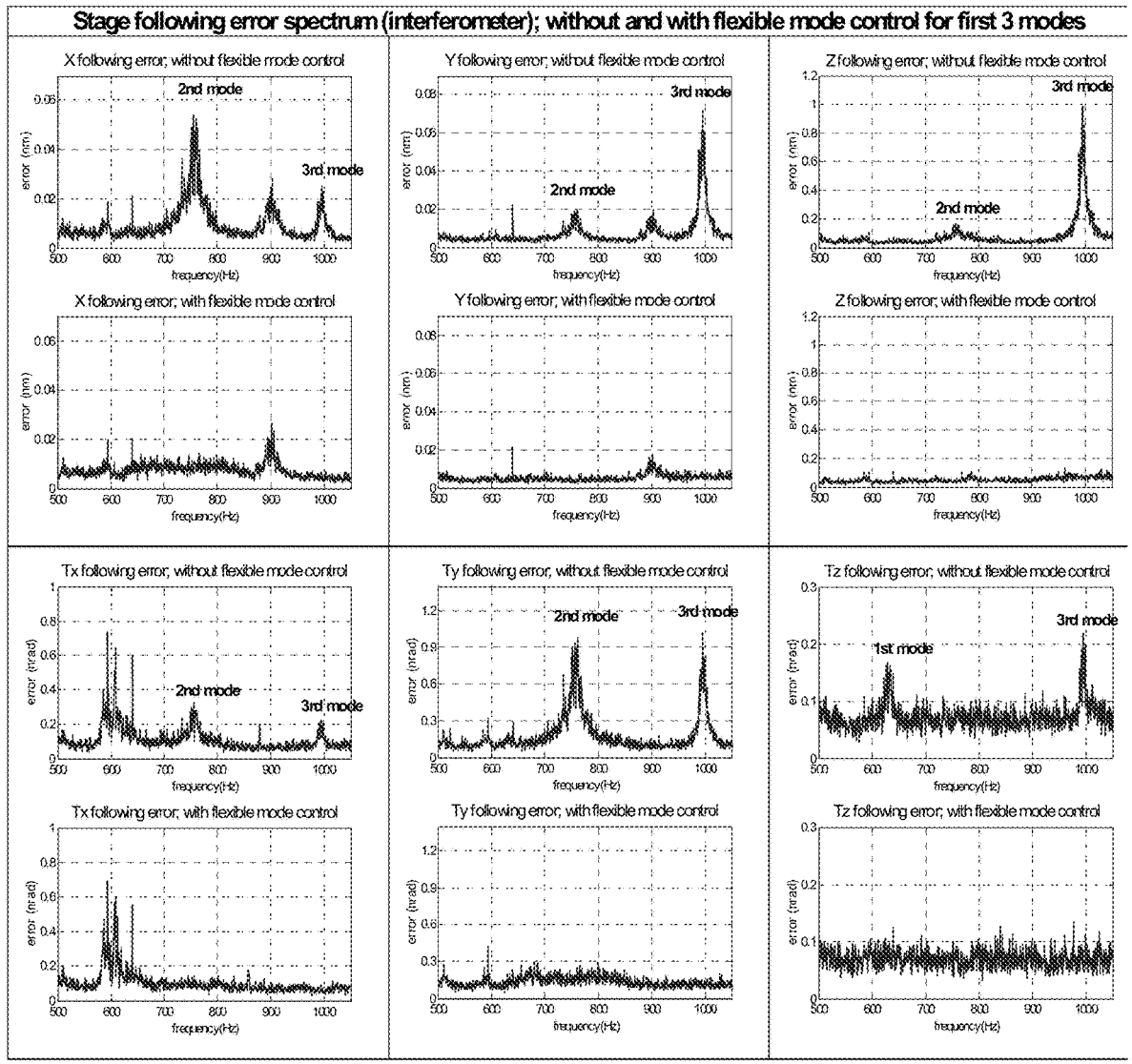
FIG. 15 includes a plurality of graphs that illustrate how stage following error is influenced by flexible mode control of flexible modes one, two and three.

For example, in one embodiment, the control system is designed and operated to attenuate flexible mode one, two, and three. In this embodiment, the targeted flexible modes are flexible mode one, two, and three, and the positioning of the flexible mode sensors 28 can be similar to that illustrated in FIG. 12A. FIG. 15 includes a plurality of graphs that illustrate how stage following error is influenced by flexible mode control of flexible mode one, two and three. FIG. 15 includes (i) a pair of graphs that illustrate X axis following error without flexible mode control and with flexible mode control; (ii) a pair of graphs that illustrate Y axis following error without flexible mode control and with flexible mode control; (iii) a pair of graphs that illustrate Z axis following error without flexible mode control and with flexible mode control; (iv) a pair of graphs that illustrate Tx (about the X axis) following error without flexible mode control and with flexible mode control; (v) a pair of graphs that illustrate Ty (about the Y axis) following error without flexible mode control and with flexible mode control; and (vi) a pair of graphs that illustrate Tz (about the Z axis) following error without flexible mode control and with flexible mode control. These graphs illustrate that the following error is reduced for each of the targeted flexible modes (flexible mode 1, 2, and 3) as a result of the flexible mode control provided herein. Thus, the damping control of flexible mode 1, 2, and 3 reduces the peak magnitudes of the following error. Stated in another fashion, control of the first three modes reduces their contributions to stage following errors as observed by interferometers. As a result thereof, the stage can be positioned faster and more accurately. This allows for increased throughput and improved quality of the workpieces.

Figure 16:
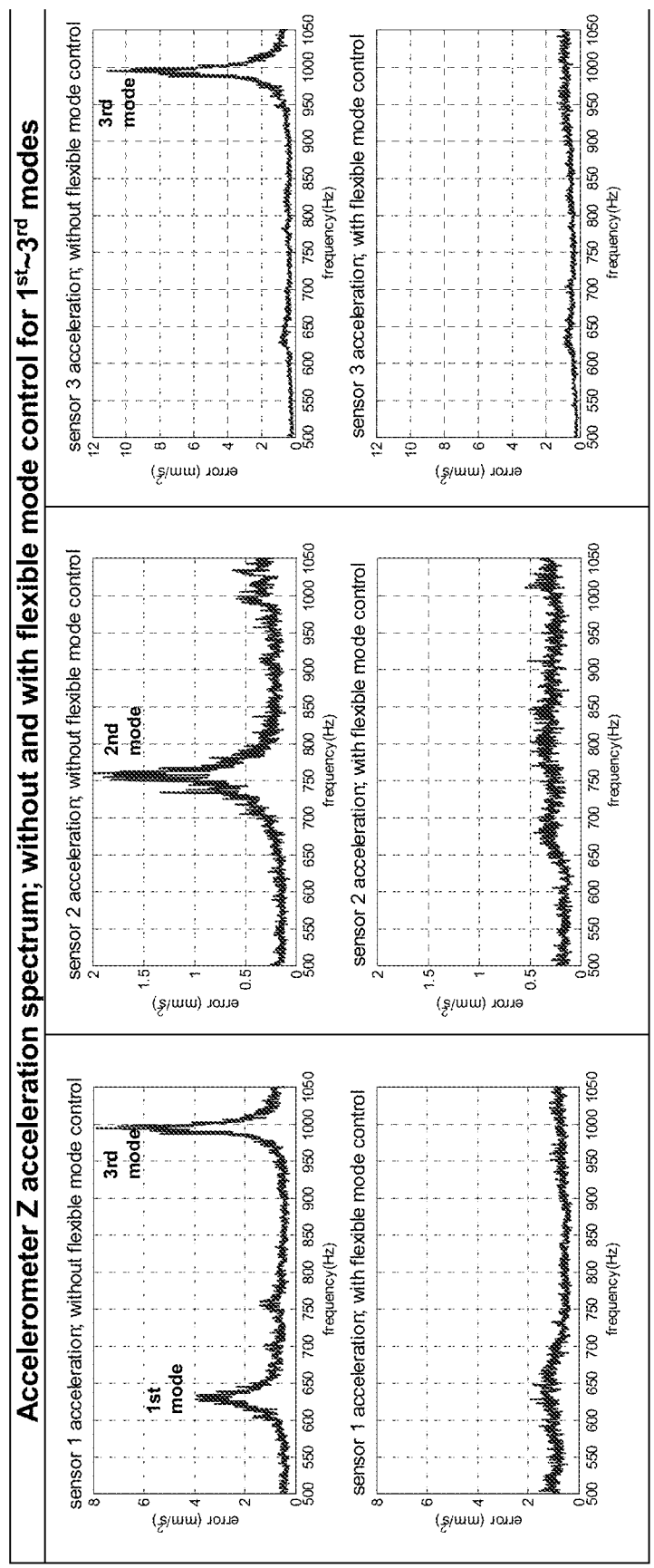
FIG. 16 includes a plurality of graphs that illustrate how stage Z axis acceleration spectrum is influenced by flexible mode control of flexible modes one, two and three.

FIG. 16 includes a plurality of graphs that illustrate how stage Z axis acceleration spectrum is influenced by flexible mode control of flexible mode one, two and three. FIG. 16 includes (i) a pair of graphs that illustrate flexible mode sensor one acceleration without flexible mode control and with flexible mode control; (ii) a pair of graphs that illustrate flexible mode sensor two acceleration without flexible mode control and with flexible mode control; and (iii) a pair of graphs that illustrate flexible mode sensor three acceleration without flexible mode control and with flexible mode control. These graphs illustrate that the acceleration is reduced for each of the targeted flexible modes (flexible mode 1, 2, and 3) as a result of the flexible mode control provided herein. Thus, the damping control of flexible mode 1, 2, and 3 reduces the peak magnitudes of the flexible mode sensors. As a result thereof, the stage can be positioned faster and more accurately. This allows for increased throughput and improved quality of the workpieces.

Figure 17:
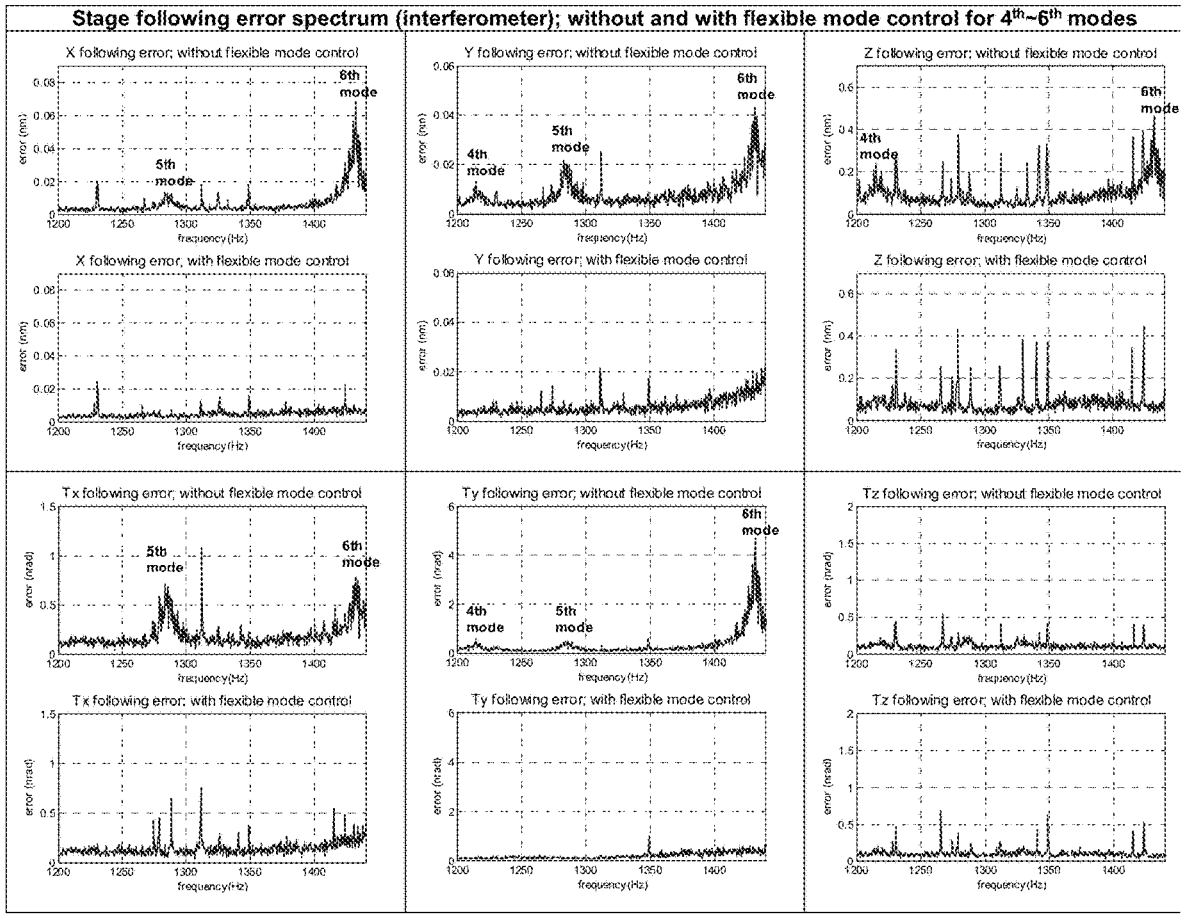
FIG. 17 includes a plurality of graphs that illustrate how stage following error is influenced by flexible mode control of flexible modes four, five, and six.

In another, non-exclusive embodiment, the control system is designed and operated to attenuate flexible mode four, five, and six. In this embodiment, the targeted flexible modes are flexible mode four, five, and six, and three, and the positioning of the flexible mode sensors 28 can be similar to that illustrated in FIG. 12B. FIG. 17 includes a plurality of graphs that illustrate how stage following error is influenced by flexible mode control of flexible mode four, five, and six. FIG. 17 includes (i) a pair of graphs that illustrate X axis following error without flexible mode control and with flexible mode control; (ii) a pair of graphs that illustrate Y axis following error without flexible mode control and with flexible mode control; (iii) a pair of graphs that illustrate Z axis following error without flexible mode control and with flexible mode control; (iv) a pair of graphs that illustrate Tx (about the X axis) following error without flexible mode control and with flexible mode control; (v) a pair of graphs that illustrate Ty (about the Y axis) following error without flexible mode control and with flexible mode control; and (vi) a pair of graphs that illustrate Tz (about the Z axis) following error without flexible mode control and with flexible mode control. These graphs illustrate that the following error is reduced for each of the targeted flexible modes (flexible mode 4, 5, and 6) as a result of the flexible mode control provided herein. Thus, the damping control of flexible mode 4, 5, and 6 reduces the peak magnitudes of the following error. Stated in another fashion, control of these flexible modes reduce their contributions to stage following errors as observed by interferometers. This allows for improved positioning of the stage and improved quality workpieces.

Figure 18:
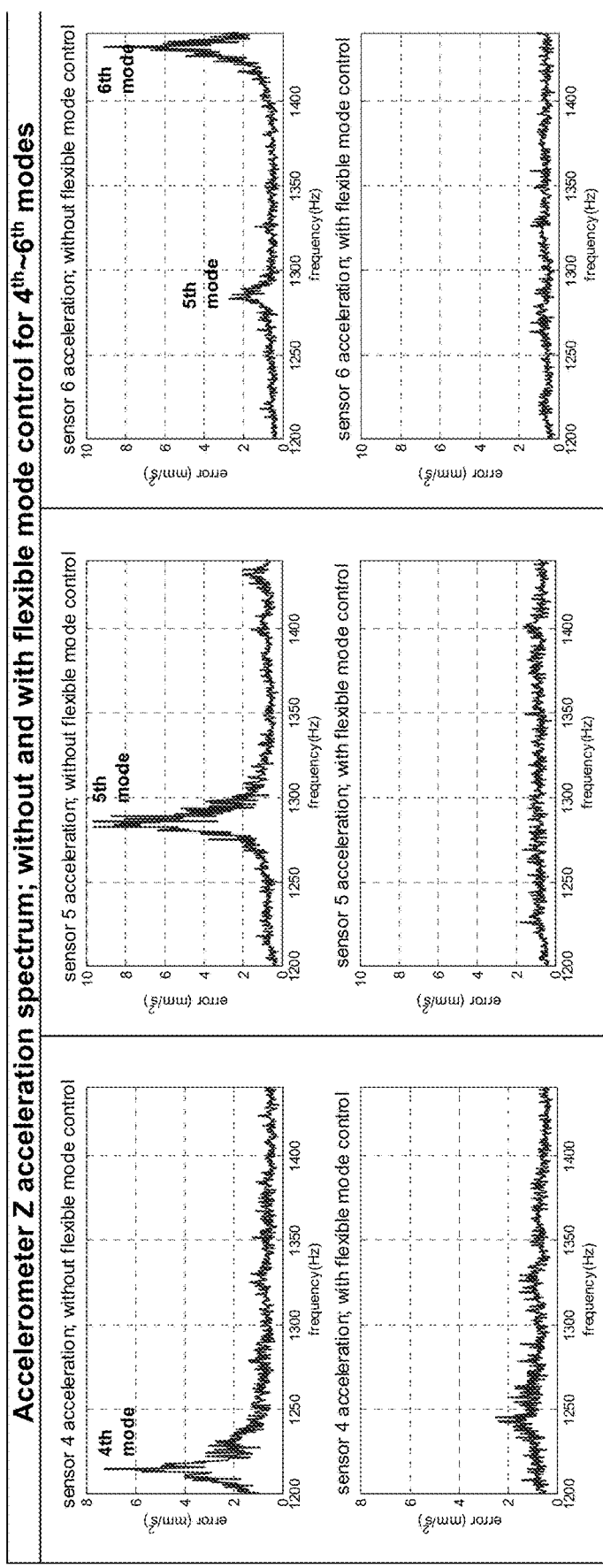
FIG. 18 includes a plurality of graphs that illustrate how stage Z axis acceleration spectrum is influenced by flexible mode control of flexible modes four, five, and six.

FIG. 18 includes a plurality of graphs that illustrate how stage Z axis acceleration spectrum is influenced by flexible mode control of flexible mode four, five, and six. FIG. 16 includes (i) a pair of graphs that illustrate flexible mode sensor four acceleration without flexible mode control and with flexible mode control; (ii) a pair of graphs that illustrate flexible mode sensor five acceleration without flexible mode control and with flexible mode control; and (i) a pair of graphs that illustrate flexible mode sensor six acceleration without flexible mode control and with flexible mode control. This graphs illustrate that the acceleration is reduced for each of the targeted flexible modes (flexible mode 4, 5, and 6) as a result of the flexible mode control provided herein. Thus, the damping control of flexible mode 4, 5, and 6 reduces the peak magnitudes of the flexible mode sensors. This allows for improved positioning of the stage and improved quality workpieces.

As yet another, non-exclusive embodiment, the control system is designed and operated to attenuate flexible mode two, three, and six. Still alternatively, the control system can be designed and operated to attenuate only one, any other combination of flexible modes.

Figure 19:
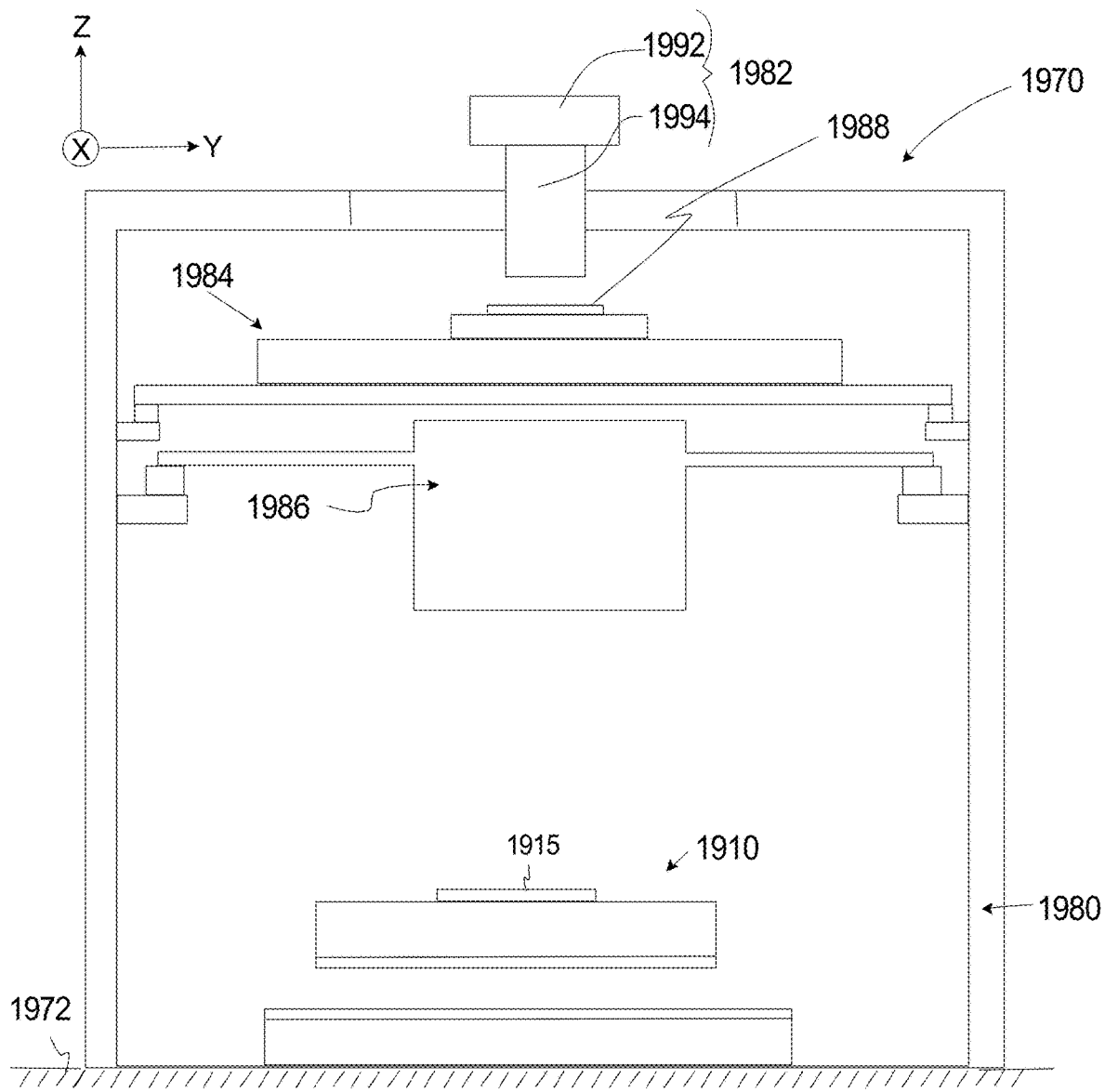
FIG. 19 is a schematic illustration of an exposure apparatus having features of the present invention.

FIG. 19 is a schematic view illustrating an exposure apparatus 1970 useful with the present invention. The exposure apparatus 1970 includes the apparatus frame 1980, an illumination system 1982 (irradiation apparatus), a reticle stage assembly 1984, an optical assembly 1986 (lens assembly), and a wafer stage assembly 1910. The stage assemblies provided herein can be used as the wafer stage assembly 1910. Alternately, with the disclosure provided herein, the stage assemblies provided herein can be modified for use as the reticle stage assembly 1984. The exposure apparatus 1970 can be an immersion system with an immersion fluid between the optical assembly 1986 and the wafer 1915.

The exposure apparatus 1970 is particularly useful as a lithographic device that transfers a pattern (not shown) of an integrated circuit from a reticle 1988 onto the semiconductor wafer 1915. The exposure apparatus 1970 mounts to the mounting base 1972, e.g., the ground, a base, or floor or some other supporting structure.

The apparatus frame 1980 is rigid and supports the components of the exposure apparatus 1970. The design of the apparatus frame 1980 can be varied to suit the design requirements for the rest of the exposure apparatus 1970.

The illumination system 1982 includes an illumination source 1992 and an illumination optical assembly 1994. The illumination source 1992 emits a beam (irradiation) of light energy. The illumination optical assembly 1994 guides the beam of light energy from the illumination source 1992 to the optical assembly 1986. The beam illuminates selectively different portions of the reticle 1988 and exposes the semiconductor wafer 1915. In FIG. 19, the illumination source 1992 is illustrated as being supported above the reticle stage assembly 1984. Alternatively, the illumination source 1992 can be secured to one of the sides of the apparatus frame 1980 and the energy beam from the illumination source 1992 is directed to above the reticle stage assembly 1984 with the illumination optical assembly 1994.

The optical assembly 1986 projects and/or focuses the light passing through the reticle to the wafer. Depending upon the design of the exposure apparatus 1970, the optical assembly 1986 can magnify or reduce the image illuminated on the reticle.

The reticle stage assembly 1984 holds and positions the reticle 1988 relative to the optical assembly 1986 and the wafer 1915. Similarly, the wafer stage assembly 1910 holds and positions the wafer 1915 with respect to the projected image of the illuminated portions of the reticle 1988.

There are a number of different types of lithographic devices. For example, the exposure apparatus 1970 can be used as scanning type photolithography system that exposes the pattern from the reticle 1988 onto the wafer 1915 with the reticle 1988 and the wafer 1915 moving synchronously. Alternatively, the exposure apparatus 1970 can be a step-and-repeat type photolithography system that exposes the reticle 1988 while the reticle 1988 and the wafer 1915 are stationary.

However, the use of the exposure apparatus 1970 and the stage assemblies provided herein are not limited to a photolithography system for semiconductor manufacturing. The exposure apparatus 1970, for example, can be used as an LCD photolithography system that exposes a flat panel display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, elevators, machine tools, metal cutting machines, inspection machines and disk drives.

As described above, a photolithography system according to the above described embodiments can be built by assembling various subsystems, including each element listed in the appended claims, in such a manner that prescribed mechanical accuracy, electrical accuracy, and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, a total adjustment is performed to make sure that accuracy is maintained in the complete photolithography system. Additionally, it is desirable to manufacture an exposure system in a clean room where the temperature and cleanliness are controlled.

Figure 20A:
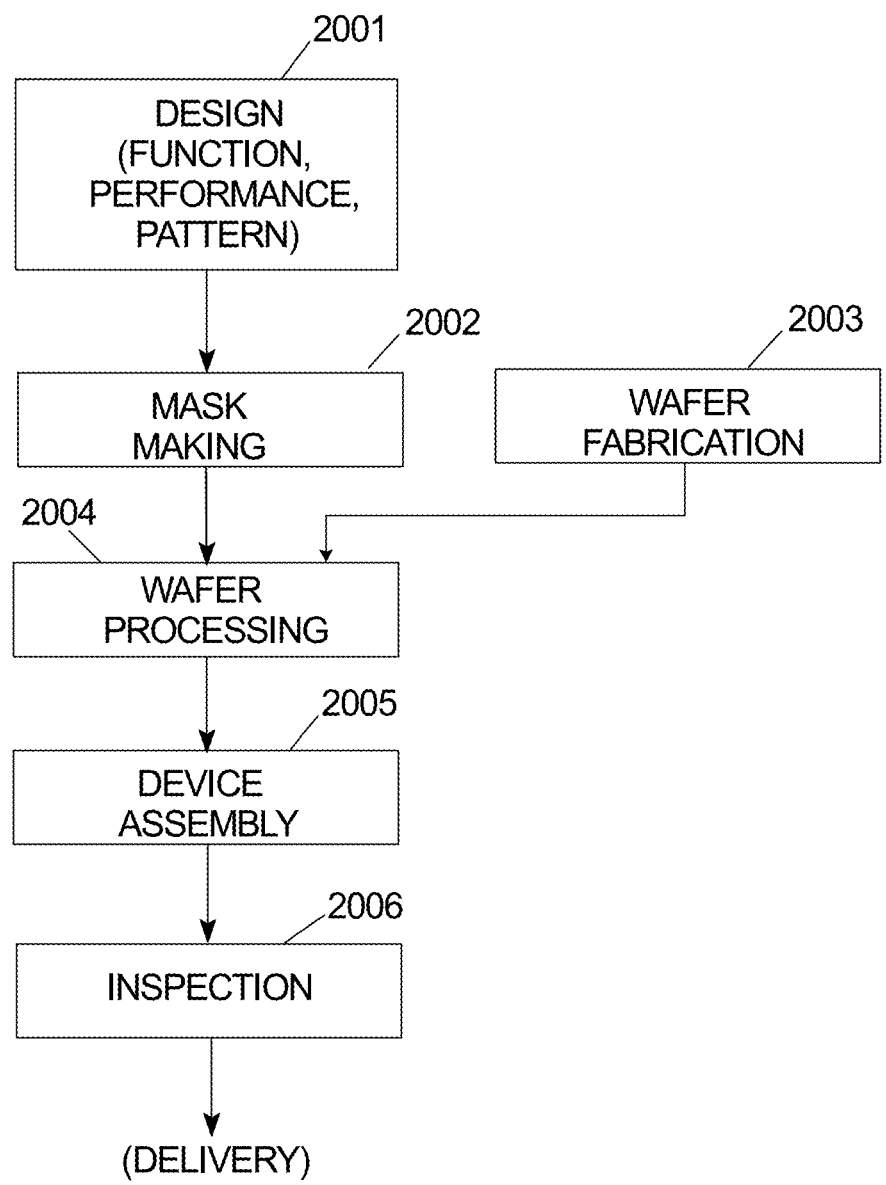
FIG. 20A is a flow chart that outlines a process for manufacturing a device in accordance with the present invention.

Further, semiconductor devices can be fabricated using the above described systems, by the process shown generally in FIG. 20A. In step 2001 the device's function and performance characteristics are designed. Next, in step 2002, a mask (reticle) having a pattern is designed according to the previous designing step, and in a parallel step 2003 a wafer is made from a silicon material. The mask pattern designed in step 2002 is exposed onto the wafer from step 2003 in step 2004 by a photolithography system described hereinabove in accordance with the present invention. In step 2005 the semiconductor device is assembled (including the dicing process, bonding process and packaging process), finally, the device is then inspected in step 2006.

Figure 20B:
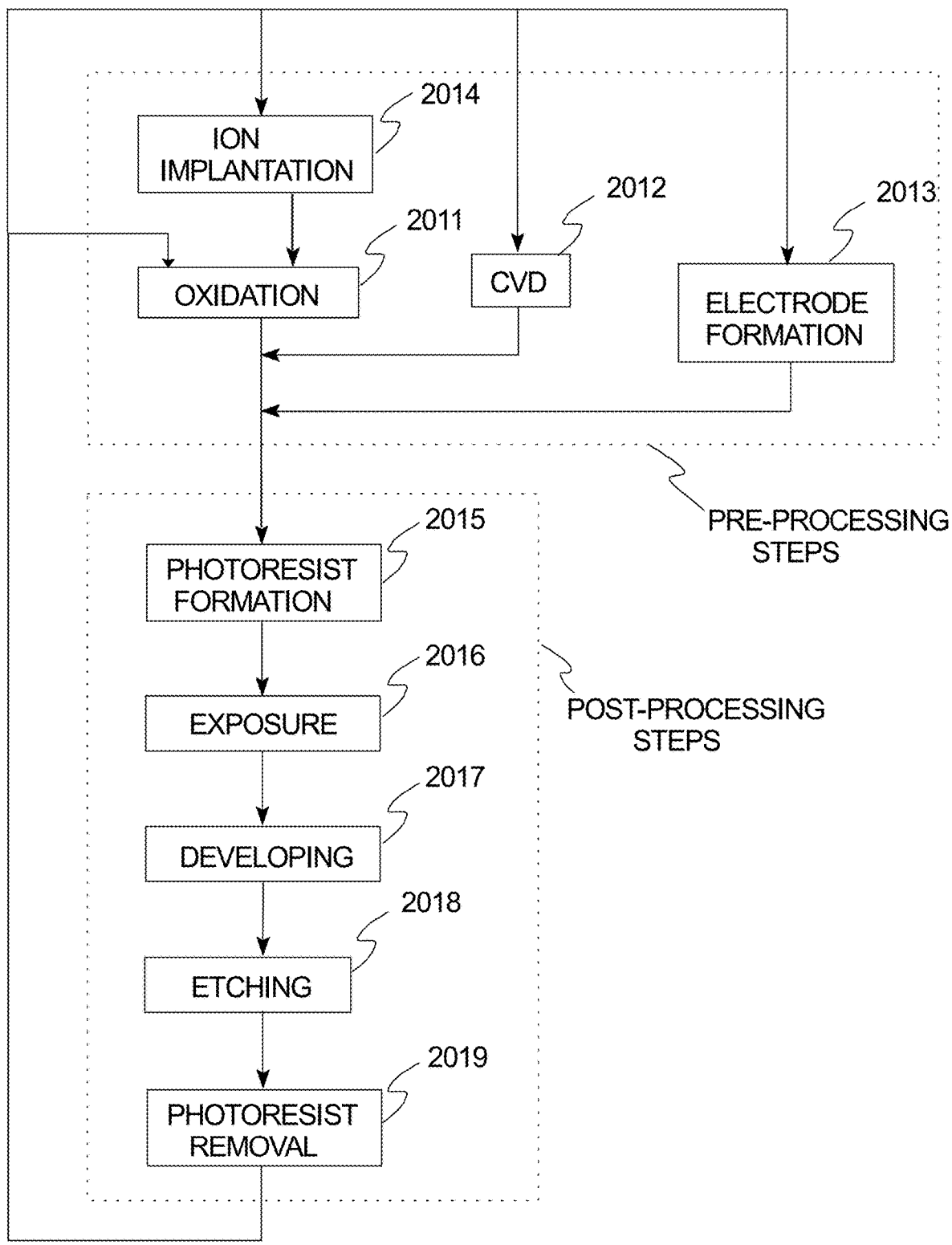
FIG. 20B is a flow chart that outlines device processing in more detail.

FIG. 20B illustrates a detailed flowchart example of the above-mentioned step 2004 in the case of fabricating semiconductor devices. In FIG. 20B, in step 2011 (oxidation step), the wafer surface is oxidized. In step 2012 (CVD step), an insulation film is formed on the wafer surface. In step 2013 (electrode formation step), electrodes are formed on the wafer by vapor deposition. In step 2014 (ion implantation step), ions are implanted in the wafer. The above mentioned steps 2011-2014 form the preprocessing steps for wafers during wafer processing, and selection is made at each step according to processing requirements.

At each stage of wafer processing, when the above-mentioned preprocessing steps have been completed, the following post-processing steps are implemented. During post-processing, first, in step 2015 (photoresist formation step), photoresist is applied to a wafer. Next, in step 2016 (exposure step), the above-mentioned exposure device is used to transfer the circuit pattern of a mask (reticle) to a wafer. Then in step 2017 (developing step), the exposed wafer is developed, and in step 2018 (etching step), parts other than residual photoresist (exposed material surface) are removed by etching. In step 2019 (photoresist removal step), unnecessary photoresist remaining after etching is removed.

Multiple circuit patterns are formed by repetition of these preprocessing and post-processing steps.

In summary, with the present invention, motor force constants for the flexible mode actuation are formulated first and then are verified through the proposed identification procedure. Active damping control using such flexible mode force constants has been successfully implemented and tested on a moving magnet planar motor stage.

It is to be understood that embodiments disclosed herein are merely illustrative of the presently preferred embodiments of the invention and that no limitations are intended to the details of construction or design herein shown other than as described in the appended claims.

What is claimed is:

1. A method for moving a stage relative to a base from a measured position to a desired position, the stage having a first targeted flexible mode, the method comprising:
coupling a magnet assembly to the stage;
coupling an array of coils to the base, the array of coils including a first coil and a second coil;
identifying an array of first flexible mode force constants for at least a portion of the array of coils for a first targeted flexible mode of the stage; wherein the first targeted flexible mode has a corresponding first resonance frequency; wherein the array of first flexible mode force constants includes (i) a first, first coil force constant for the first coil represents how much flexible mode motion is created by a first predetermined current at the first resonance frequency that is directed to the first coil, and (ii) a first, second coil force constant for the second coil represents how much flexible mode motion is created by a second predetermined current at the first resonance frequency that is directed to the second coil; wherein the first, second coil force constant is different from the first, first coil force constant; and
directing current to the array of coils with a control system that includes a processor to generate a force that levitates the stage relative to the base and moves the stage relative to the base; wherein, the control system utilizes the first flexible mode force constants to generate at least one current command that controls the current to the array of coils to levitate and move the stage while actively suppressing the excitation of the first targeted flexible mode.

2. The method of claim 1 wherein the step of directing current includes the control system having a first flexible mode feedback controller with a first damping filter that is used to suppress the vibrations of the first targeted flexible mode.

3. The method of claim 2 wherein the step of directing current includes determining a correction phase of the first damping filter of the first flexible mode damping controller needed to attenuate the vibrations of the first targeted flexible mode.

4. The method of claim 3 wherein the step of determining a correction phase includes feeding an open loop force command to at least one filter, and subsequently to an amplifier to direct current to the coils, wherein the open loop force command is at the first resonance frequency.

5. The method of claim 3 further comprising the step of identifying an array of second flexible mode force constants for at least a portion of the array of coils for a second targeted flexible mode; wherein the second targeted flexible mode has a corresponding second resonance frequency; wherein the array of second flexible mode force constants includes (i) a second, first coil force constant for the first coil represents how much flexible mode motion is created by a third predetermined current at the second targeted flexible mode that is directed to the first coil, and (ii) a second, second coil force constant for the second coil represents how much flexible mode motion is created by a fourth predetermined current at the second targeted flexible mode that is directed to the second coil; wherein the second, second coil force constant is different from the second, first coil force constant; and wherein the step of directing current includes the step of utilizing the second flexible mode force constants to generate at least one current command that controls the current to the array of coils to levitate and move the stage while actively suppressing the excitation of the second targeted flexible mode.

6. The method of claim 5 wherein the step of directing current includes the control system having a second flexible mode feedback controller with a second damping filter that is used to suppress the vibrations of the second targeted flexible mode.

7. The method of claim 6 further comprising the step of identifying an array of third flexible mode force constants for a third targeted flexible mode; wherein the third targeted flexible mode has a corresponding third resonance frequency; wherein the array of third flexible mode force constants includes (i) a third, first coil force constant for the first coil represents how much flexible mode motion is created by a fifth predetermined current at the third targeted flexible mode that is directed to the first coil, and (ii) a third, second coil force constant for the second coil represents how much flexible mode motion is created by a sixth predetermined current at the third targeted flexible mode that is directed to the second coil; wherein the third, second coil force constant is different from the third, first coil force constant; and wherein the step of directing current includes the step of utilizing the third flexible mode force constants to generate at least one current command that controls the current to the array of coils to levitate and move the stage while actively suppressing the excitation of the third targeted flexible mode.

8. The method of claim 6 further comprising the steps of identifying a correction phase of the second damping filter of the second flexible mode damping controller needed to attenuate the vibrations of the second targeted flexible mode.

9. The method of claim 8 wherein the step of identifying a correction phase of a first damping filter of the first flexible mode damping controller includes feeding a first open loop force command to at least one first filter, and subsequently to an amplifier to direct current to the coils, wherein the first open loop force command is at the first resonance frequency; and wherein the step of identifying a correction phase of a second damping filter of the second flexible mode damping controller includes feeding a second open loop force command to at least one second filter, and subsequently to an amplifier to direct current to the coils, wherein the second open loop force command is at the second resonance frequency.

10. The method of claim 1 wherein the step of directing current includes the control system including a flexible mode feedback controller that uses phase correction to reduce the influence of phase lag on the flexible mode control.

11. The method of claim 1 wherein the step of directing current includes the control system utilizing a pseudo inverse based commutation with the first flexible mode force constants to generate at least one current command that accounts for a rigid body mode of the stage and at least one the first targeted flexible mode of the stage.

12. The method of claim 1 further comprising the steps of coupling a flexible mode sensor to the stage that generates flexible mode information, wherein the step of identifying an array of first flexible mode force constants includes using the flexible mode information to identify the array of first flexible mode force constants.

13. The method of claim 1 further comprising coupling a flexible mode sensor to the stage, the flexible mode sensor sensing motion corresponding to the first targeted flexible mode of the stage and generating a sensor signal, and wherein the step of identifying an array of first flexible mode force constants includes using the flexible mode sensor.

14. The method of claim 13 wherein the step of directing current to the array of coils includes utilizing the sensor signal to generate at least one current command that controls the current to the array of coils to levitate and move the stage while actively suppressing the excitation of the first targeted flexible mode.

15. The method of claim 1 further comprising coupling a flexible mode sensor to the stage, the flexible mode sensor sensing motion corresponding to the first targeted flexible mode of the stage and generating a sensor signal, and wherein the step of directing current to the array of coils includes utilizing the sensor signal to generate at least one current command that controls the current to the array of coils to levitate and move the stage while actively suppressing the excitation of the first targeted flexible mode.

16. A stage assembly for positioning a workpiece, the stage assembly comprising:
a stage that retains the workpiece, the stage including a magnet assembly, the stage having a first targeted flexible mode;
a measurement system that senses rigid body movement of the stage and generates a measurement signal;
a flexible mode sensor coupled to the stage, the flexible mode sensor sensing motion corresponding to the first targeted flexible mode of the stage and generating a sensor signal;
a base that includes an array of coils, the array of coils including a first coil and a second coil; and
a control system that directs current to at least one of the coils to generate a force that levitates the stage relative to the base and moves the stage relative to the base from a measured position to a desired position; wherein, the control system uses both the measurement signal and the sensor signal to generate at least one current command that levitates and moves the stage while inhibiting the excitation of the first targeted flexible mode; wherein the control system includes a first flexible mode feedback controller having a first damping filter that uses the sensor signals to suppress the vibrations of the first targeted flexible mode.

17. The stage assembly of claim 16 wherein the control system directs current to the coils utilizing an array of first flexible mode force constants for at least a portion of the array of coils for the first targeted flexible mode in the active damping control of the first targeted flexible mode; wherein the first targeted flexible mode has a corresponding first resonance frequency; wherein the array of first flexible mode force constants includes (i) a first, first coil force constant for the first coil represents how much flexible mode motion is created by a first predetermined current at the first resonance frequency that is directed to the first coil, and (ii) a first, second coil force constant for the second coil represents how much flexible mode motion is created by a second predetermined current at the first resonance frequency that is directed to the second coil; wherein the first, second coil force constant is different from the first, first coil force constant.

18. The stage assembly of claim 17 wherein the control system directs current to the coils utilizing an array of second flexible mode force constants for at least a portion of the array of coils for a second targeted flexible mode to actively suppress the excitation of the second targeted flexible mode; wherein the second targeted flexible mode has a corresponding second resonance frequency; wherein the array of second flexible mode force constants includes (i) a second, first coil force constant for the first coil represents how much flexible mode motion is created by a third predetermined current at the second targeted flexible mode that is directed to the first coil, and (ii) a second, second coil force constant for the second coil represents how much flexible mode motion is created by a fourth predetermined current at the second targeted flexible mode that is directed to the second coil; wherein the second, second coil force constant is different from the second, first coil force constant.

19. The stage assembly of claim 18, wherein the flexible mode sensor is used to identify the first flexible mode force constants and the second flexible mode force constants.

20. The stage assembly of claim 18, wherein the flexible mode sensor being is used to identify the first flexible mode force constants of the first targeted flexible mode.

\* \* \* \* \*